(12) United States Patent
Ueno

(10) Patent No.: US 10,036,786 B2
(45) Date of Patent: Jul. 31, 2018

(54) MAGNETIC FIELD MEASURING APPARATUS AND MANUFACTURING METHOD OF MAGNETIC FIELD MEASURING APPARATUS

(71) Applicant: SEIKO EPSON CORPORATION, Tokyo (JP)

(72) Inventor: Hitoshi Ueno, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/614,961

(22) Filed: Jun. 6, 2017

(65) Prior Publication Data
US 2017/0356969 A1 Dec. 14, 2017

(30) Foreign Application Priority Data
Jun. 14, 2016 (JP) .................. 2016-117701

(51) Int. Cl.
| *F21V 7/04* | (2006.01) |
| *G01R 33/26* | (2006.01) |
| *G01R 33/032* | (2006.01) |
| *G01R 33/24* | (2006.01) |

(52) U.S. Cl.
CPC ........... *G01R 33/26* (2013.01); *G01R 33/032* (2013.01); *G01R 33/243* (2013.01)

(58) Field of Classification Search
CPC ..... G01R 33/032; G01R 33/243; G01R 33/26
See application file for complete search history.

(56) References Cited

U.S. PATENT DOCUMENTS

| 8,405,389 B2 | 3/2013 | Sugioka et al. |
| 9,024,634 B2* | 5/2015 | Hokari ................... G01R 33/26 |
| | | 324/305 |
| 2011/0101974 A1* | 5/2011 | Nagasaka .......... G01R 33/0322 |
| | | 324/244.1 |

FOREIGN PATENT DOCUMENTS

| JP | 2009-162554 A | 7/2009 |
| JP | 2014-119376 A | 6/2014 |
| JP | 2015-102492 A | 6/2015 |

* cited by examiner

*Primary Examiner* — Seung Lee
(74) *Attorney, Agent, or Firm* — Oliff PLC

(57) ABSTRACT

A magnetic field measuring apparatus includes a first cell and a second cell in which alkali metal atoms are respectively enclosed, a light guide that enters laser light into the first cell and the second cell, and a position adjustment mechanism, and a position of a second reference surface with respect to a first reference surface is adjusted and orientations of optical axes of a beam light relating to the first reference surface and a beam light relating to the second reference surface are the same direction.

8 Claims, 12 Drawing Sheets

MAGNETIC FIELD MEASURING APPARATUS AND MANUFACTURING METHOD OF MAGNETIC FIELD MEASURING APPARATUS

BACKGROUND

1. Technical Field

The present invention relates to a magnetic field measuring apparatus and a manufacturing method of a magnetic field measuring apparatus.

2. Related Art

As a magnetic field measuring apparatus, a highly sensitive atomic magnetic sensor using atomic spin in an alkali metal gas or rare gas is proposed.

For example, Patent Document 1 (JP-A-2009-162554) discloses an atomic magnetic sensor including a probe light source and a medium having a first measurement position and a second measurement position in which the probe light propagates, and directly measuring a difference in magnetic field intensity between the first measurement position and the second measurement position as a difference in polarization rotation angle of the probe light along a propagation path of the probe light.

Patent Document 1 shows an example in which the first measurement position and the second measurement position are provided within the same cell and an example in which the positions are provided within separate cells.

Further, for example, Patent Document 2 (JP-A-2015-102492) discloses a magnetic field measuring apparatus having a light source, a cell housing a gas inside, a polarization separating unit that separates light output from the light source into a polarization component in a first axis direction and a polarization component in a second axis direction, a light quantity measuring unit that measures a light quantity of the polarization component in the second axis direction, and a magnetic field measuring unit that measures a magnetic field using a light quantity in the first axis direction transmitted through the cell based on a measurement result of the light quantity by the light quantity measuring unit.

Patent Document 2 shows an example of a multichannel system that enters the polarization component in the first axis direction into a plurality of cells.

In the atomic magnetic sensor of Patent Document 1, it is stated that the traveling direction of the probe light transmitted through the first measurement position is reversed and the light is entered into the second measurement position and transmitted therethrough. Thereby, it is stated that it is not necessary to provide a plurality of photodetectors for respectively detecting the polarization rotation angles of the probe light in the first measurement position and the second measurement position, and noise based on differences in characteristics among the individual photodetectors may be prevented from mixing into the measurement result of the magnetic field.

However, it is technically difficult to enter the probe light into the first measurement position and the second measurement position from the respective determined directions. In addition, in the case where the first measurement position and the second measurement position are provided in separate cells, it is required that the probe light is accurately entered into the individual cells from the determined directions.

Further, to apply the technical idea of the atomic magnetic sensor in Patent Document 1 to the multichannel-system magnetic field measuring apparatus shown in Patent Document 2, it is necessary to respectively provide pluralities of cells in the first measurement position and the second measurement position, and there is a problem that the difficulty in position adjustment of the pluralities of cells with respect to the incident direction of the probe light is further increased.

SUMMARY

An advantage of some aspects of the invention is to solve at least a part of the problems described above, and the invention can be implemented as the following forms or application examples.
Application Example A magnetic field measuring apparatus according to this application example includes a light irradiation part that radiates linearly-polarized light, a first cell and a second cell with alkali metal atoms enclosed therein sequentially placed in a sensitive direction of a magnetic field, a first optical device placed on a first reference surface and entering the linearly-polarized light into the first cell, and a second optical device placed on a second reference surface and entering the linearly-polarized light into the second cell, wherein a position of the second reference surface with respect to the first reference surface is adjusted so that an orientation of an optical axis of a first reflected light of light relating to the first reference surface and an orientation of an optical axis of a second reflected light of light relating to the second reference surface in parallel to that light may be the same direction.

According to this application example, the position of the second reference surface with respect to the first reference surface is adjusted so that the orientation of the optical axis of the first reflected light of the light relating to the first reference surface and the orientation of the optical axis of the second reflected light of the light relating to the second reference surface in parallel to that light may be the same direction. The first optical device is provided on the first reference surface and the second optical device is provided on the second reference surface, and thereby, the linearly-polarized lights enter the first cell and the second cell from the same direction. Therefore, a gradio-type magnetic field measuring apparatus, in which the orientations of the optical axes of the linearly-polarized lights entering the respective first cell and second cell are the same and an influence of an external magnetic field is properly eliminated, that can accurately measure a magnetic field generated from a magnetic field source may be provided.

In the magnetic field measuring apparatus according to the application example, it is preferable that an optical axis detection part that can radiate beam light as the light and detect an orientation of an optical axis of the first reflected light of the beam light relating to the first reference surface and an orientation of an optical axis of the second reflected light of the beam light relating to the second reference surface is provided.

According to this configuration, the optical axis detection part is provided, and thereby, a gradio-type magnetic field measuring apparatus that can verify whether or not the orientation of the optical axis of the linearly-polarized light entering the first cell and the orientation of the optical axis of the linearly-polarized light entering the second cell are the same may be provided.

In the magnetic field measuring apparatus according to the application example, it is preferable that reflection members are provided on the first reference surface and the second reference surface.

According to this configuration, the beam light is reliably reflected by the reflection members, and thereby, the orientation of the optical axis of the first reflected light of the beam light relating to the first reference surface and the orientation of the optical axis of the second reflected light of the beam light relating to the second reference surface may be correctly detected.

In the magnetic field measuring apparatus according to the application example, a third cell placed in a direction orthogonal to the sensitive direction with respect to the first cell, and a fourth cell placed in a direction orthogonal to the sensitive direction with respect to the second cell may be provided.

According to this configuration, a gradio-type and multichannel-type magnetic field measuring apparatus that can properly eliminate the influence of the external magnetic field and accurately measure the magnetic field generated from the magnetic field source may be provided.

In the magnetic field measuring apparatus according to the application example, the light irradiation part may include a first light irradiation part that irradiates the first cell and the third cell with the linearly-polarized light and a second light irradiation part that irradiates the second cell and the fourth cell with the linearly-polarized light.

According to this configuration, compared to the case where the linearly-polarized light is radiated from the single light irradiation part to the respective cells placed in the gradio-type and multichannel-type, the light quantities of the linearly-polarized lights output from the respective first light irradiation part and the second light irradiation part may be suppressed.

In the magnetic field measuring apparatus according to the application example, the sensitive direction of the magnetic field and incident directions of the linearly-polarized light in the first cell and the second cell may cross.

According to this configuration, it is not necessarily required to place the magnetic field source (measuring object) in the incident directions of the linearly-polarized light entering the respective cells, and thereby, a gradio-type magnetic field measuring apparatus with the improved degree of freedom in the placement of the magnetic field source may be provided.

Application Example

A manufacturing method of a magnetic field measuring apparatus according to this application example is a manufacturing method of a magnetic field measuring apparatus including a light irradiation part that radiates linearly-polarized light, a first cell and a second cell with alkali metal atoms enclosed therein, a first optical device placed on a first reference surface and entering the linearly-polarized light into the first cell, and a second optical device placed on a second reference surface and entering the linearly-polarized light into the second cell, and the method includes a placement step of sequentially placing the first cell and the second cell in a sensitive direction of a magnetic field, an optical axis detection step of detecting an orientation of an optical axis of a first reflected light of light relating to the first reference surface and an orientation of an optical axis of a second reflected light of light relating to the second reference surface in parallel to that light, and a position adjustment step of adjusting a position of the second reference surface with respect to the first reference surface so that the orientation of the optical axis of the first reflected light and the orientation of the optical axis of the second reflected light maybe the same direction based on a result of the optical axis detection step.

According to this application example, at the position adjustment step, the position of the second reference surface with respect to the first reference surface is adjusted so that the orientation of the optical axis of the first reflected light and the orientation of the optical axis of the second reflected light may be the same direction based on the result of the optical axis detection step. The first optical device is provided on the first reference surface and the second optical device is provided on the second reference surface, and thereby, the linearly-polarized lights enter the first cell and the second cell from the same direction. Therefore, a manufacturing method of a gradio-type magnetic field measuring apparatus, in which the orientations of the optical axes of the linearly-polarized lights entering the respective first cell and second cell are the same and the first cell and the second cell are placed in the sensitive direction of the magnetic field so that an influence of an external magnetic field can be properly eliminated, that can accurately measure a magnetic field generated from a magnetic field source may be provided.

In the manufacturing method of the magnetic field measuring apparatus according to the application example, it is preferable that the optical axis detection step includes a first step of detecting the orientation of the optical axis of the first reflected light, and a second step of detecting the orientation of the optical axis of the second reflected light, and the second step is performed after the placement step and detects the orientation of the optical axis of the second reflected light with reference to the orientation of the optical axis of the first reflected light detected at the first step.

According to this method, with reference to the orientation of the optical axis of the first reflected light of the light relating to the first reference surface, the orientation of the optical axis of the second reflected light of the light relating to the second reference surface in parallel to that light is detected, and thereby, the position of the second reference surface with respect to the first reference surface may be easily adjusted.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
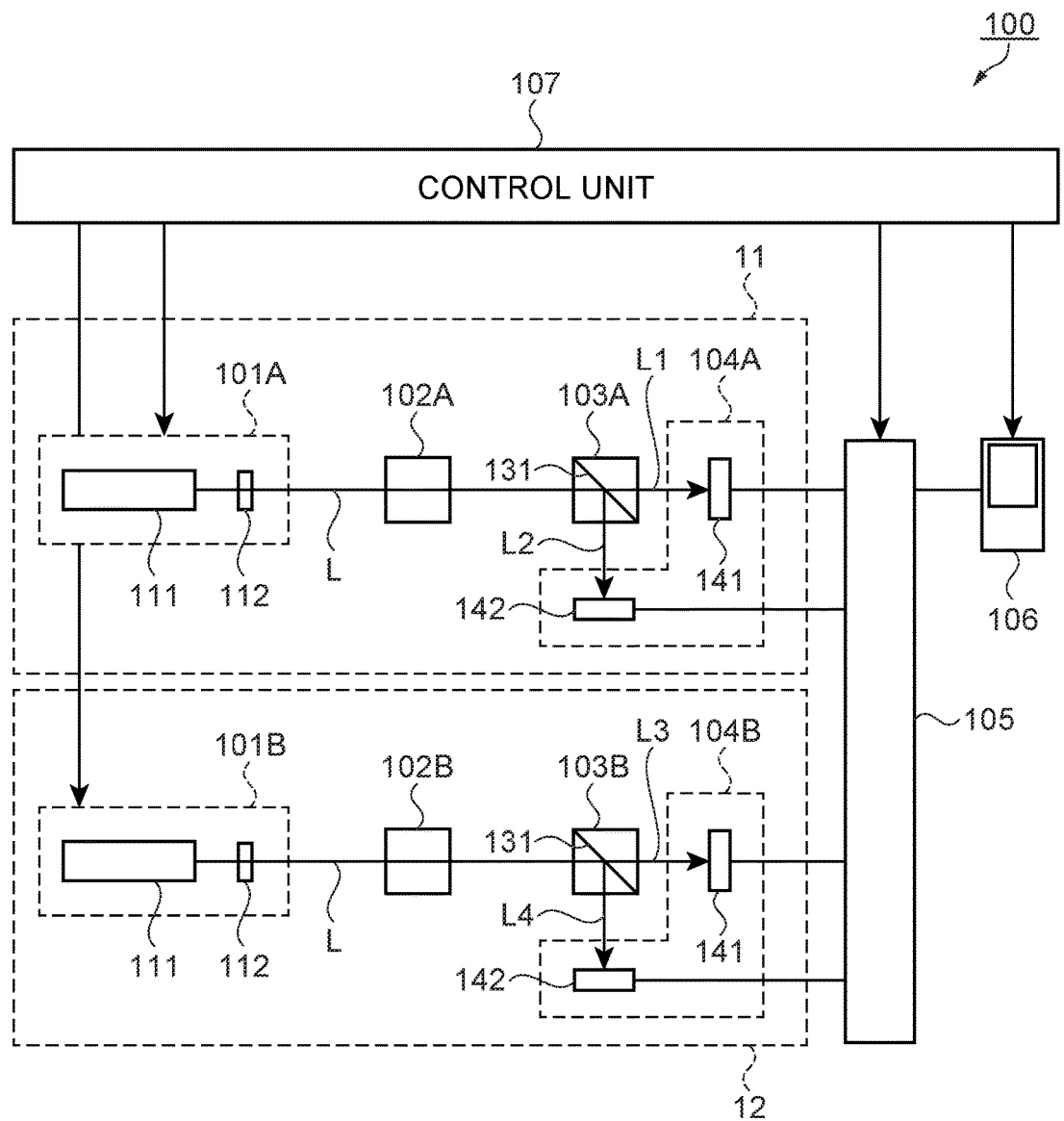
FIG. 1 is a block diagram showing a configuration of a magnetic field measuring apparatus of the first embodiment.

As below, embodiments of the invention will be explained with reference to the drawings. Note that, in the drawings for use, the parts to be explained are appropriately enlarged or reduced for recognition.

The respective embodiments to be explained will be illustrated with an example of an optical pumping magnetic field measuring apparatus that can measure a minute magnetic field generated from e.g. a heart, brain, or the like of a living body as a magnetic field source to be measured. Further, the magnetic field measuring apparatus is an apparatus in which a gradio-type arrangement of magnetic sensors that eliminates the influence of the external magnetic field in the magnetic field measurement using a difference in magnitude of the magnetic field gradients caused by the distances between the magnetic field source and the magnetic sensors is introduced.

First Embodiment

Magnetic Field Measuring Apparatus

A magnetic field measuring apparatus of the embodiment will be explained with reference to FIG. 1. FIG. 1 is a block diagram showing a configuration of the magnetic field measuring apparatus of the first embodiment.

As shown in FIG. 1, the magnetic field measuring apparatus 100 of the embodiment includes a measurement magnetic sensor 11, a reference magnetic sensor 12, a signal processing unit 105, a display unit 106, and a control unit 107 that controls the units. The measurement magnetic sensor 11 includes a first light irradiation part 101A, a first cell 102A, a first polarization separating part 103A, and a first light receiving part 104A. The reference magnetic sensor 12 includes a second light irradiation part 101B, a second cell 102B, a second polarization separating part 103B, and a second light receiving part 104B.

The magnetic field measuring apparatus 100 irradiates gaseous alkali metal atoms enclosed in a cell with pump light and excite the atoms and irradiates the spin-polarized alkali metal atoms by excitation with probe light as linearly-polarized light. The alignment direction of the spin polarization of the alkali metal atoms is affected by a magnetic field and changes. The radiated probe light is affected by the alignment direction of the spin polarization and the rotation angle of the polarization plane changes. The rotation angle of the polarization plane is electrically detected, and thereby, the magnitude (intensity) of the magnetic field is measured. Each of the first light irradiation part 101A and the second light irradiation part 101B is adapted to output a laser light L that serves as the pump light and the probe light. That is, the magnetic field measuring apparatus 100 of the embodiment includes two magnetic sensors of an optical pumping system and a single-beam system.

The respective two magnetic sensors have basically the same configuration, and the respective configurations of the measurement magnetic sensor 11 will be explained and the detailed explanation of the reference magnetic sensor 12 will be omitted. Therefore, in the explanation, the first light irradiation part 101A and the second light irradiation part 101B are collectively referred to as "light irradiation part 101" and the first cell 102A and the second cell 102B are collectively referred to as "cell 102". Further, the first polarization separating part 103A and the second polarization separating part 103B are collectively referred to as "polarization separating part 103", and the first light receiving part 104A and the second light receiving part 104B are collectively referred to as "light receiving part 104".

The light irradiation part 101 has a light source 111 and a conversion part 112. The light source 111 is a device that generates the laser light L and has e.g. a laser diode and a drive circuit therefor. The frequency of the laser light L is set to a frequency corresponding to transition of the hyperfine structure level of the alkali metal atoms enclosed in the cell 102. The conversion part 112 converts the optical vibration direction of the laser light L output from the light source 111 into a predetermined direction. That is, the conversion part 112 is e.g. a polarizer and outputs the laser light L with the angle of the polarization plane at a predetermined angle from the light irradiation part 101. The laser light L output from the light irradiation part 101 is radiated to the cell 102 via a light guide member such as an optical fiber (not shown), for example. Note that the laser light L may be radiated from the light irradiation part 101 to the cell 102 directly not via the light guide member, however, the size and the placement of the light irradiation part 101 are less restricted using the light guide member.

Inside of the cell 102, alkali metal atoms of e.g. potassium (K) or cesium (Cs) are enclosed. In the embodiment, cesium (Cs) is enclosed. The cell 102 is formed using a material having light transmissivity, non-reactive to the enclosed alkali metal, and non-permeable to the alkali metal atoms, e.g. quartz glass or borosilicate glass. Note that the material of the cell is not limited to glass, but may be any material that satisfies the above described requirements, e.g. a resin.

The laser light L transmitted through the cell 102 enters the polarization separating part 103. Note that the laser light L transmitted through the cell 102 may be guided to the polarization separating part 103 via a light guide member.

For the polarization separating part 103, e.g. a polarization beam splitter formed by bonding of two rectangular prisms is used. For example, a dielectric multilayer film having different refractive indices is formed on a prism interface 131 as a bonding surface of the two rectangular prisms. The polarization separating part 103 is placed so that the laser light L as linearly-polarized light transmitted through the cell 102 may enter the prism interface 131. The laser light L entering the prism interface 131 is separated into polarized light L1 (polarized light L3) having a first polarization plane (a vibration surface of the linearly-polarized light) parallel to the incidence plane of the prism interface 131 and polarized light L2 (polarized light L4) having a second polarization plane orthogonal to the first polarization plane. The polarized light L1 (polarized light L3) is transmitted through the polarization separating part 103 and enters one light receiving element 141 provided in the light receiving part 104. The polarized light L2 (polarized light L4) is reflected by the prism interface 131 (dielectric multilayer film) and enters another light receiving element 142 provided in the light receiving part 104. The incidence plane of the prism interface 131 refers to a plane containing the normal of the prism interface 131 and the optical axis of the laser light L entering the prism interface 131.

Note that the conversion part 112 converts the polarization plane of the laser light L as the linearly-polarized light to be parallel to the incidence plane of the prism interface 131. In other words, the polarization separating part 103 is placed on the optical axis of the laser light L between the cell 102 and the light receiving part 104 so that the orientation of the incidence plane of the prism interface 131 may be the same as the orientation of the polarization plane of the laser light L converted by the conversion part 112. Thereby, when there is no magnetic field within the cell 102 (no magnetic field is applied to the cell 102), the angle of the polarization plane of the laser light L transmitted through the cell 102 does not change, and the laser light L entering the polarization separating part 103 is separated into the polarized light L1 (polarized light L3) and the polarized light L2 (polarized light L4) at respective equal intensity levels. When a magnetic field is applied to the cell 102, the angle (orientation) of the polarization plane of the laser light L is affected by the magnetic field and changes, and a difference in intensity is caused between the polarized light L1 (polarized light L3) and the polarized light L2 (polarized light L4) separated by the polarization separating part 103. That is, the rotation angle of the polarization plane of the laser light L, i.e., the magnitudes (intensity) of the magnetic fields respectively applied to the two magnetic sensors may be obtained from the difference in intensity between the polarized light L1 (polarized light L3) and the polarized light L2 (polarized light L4).

The light receiving part 104 has the light receiving element 141 and the light receiving element 142 with sensitivity to the wavelength of the laser light L. The light receiving elements 141, 142 include e.g. photodiodes. As described above, the light receiving element 141 receives the polarized light L1 (polarized light L3) and outputs a signal according to the received light quantity to the signal processing unit 105. The light receiving element 142 receives the polarized light L2 (polarized light L4) and outputs a signal according to the received light quantity to the signal processing unit 105.

The polarization separating part 103 and the light receiving part 104 in the embodiment forms an example of a rotation angle detection unit that detects the rotation angle of the polarization plane of the probe light.

The signal processing unit 105 calculates the magnitude (intensity) of the magnetic field in a measurement axis (in the embodiment, in a direction along the optical axis of the laser light L). As described above, the amount of change of the rotation angle of the polarization plane in the laser light L before and after the transmission through the cell 102 depends on the magnitude (intensity) of the magnetic field applied to the cell 102. The signal processing unit 105 first calculates the rotation angle of the polarization plane using the signals from the light receiving element 141 and the light receiving element 142, and then, calculates the magnitude (intensity) of the magnetic field from the rotation angle. Specifically, a difference in photocurrent between the polarized light L1 (polarized light L3) and the polarized light L2 (polarized light L4) is obtained, and the magnitude (intensity) of the magnetic field is calculated using the difference.

Further, according to the method of obtaining the difference in photocurrent between the polarized light L1 (polarized light L3) and the polarized light L2 (polarized light L4), also, the orientation of the magnetic field may be obtained. For example, a sign is considered with the difference in photocurrent as a value obtained by subtraction of the photocurrent of the polarized light L2 (polarized light L4) from the photocurrent of the polarized light L1 (polarized light L3). Here, when there is a magnetic field in a direction in which the laser light L is transmitted through the cell 102, if the polarization separating part 103 is placed so that the polarization plane of the laser light L after transmission through the cell 102 may rotate, the photocurrent of the polarized light L1 (polarized light L3) may increase, and the photocurrent of the polarized light L2 (polarized light L4) may decrease, the sign of the difference is plus (+). In the placement state of the polarization separating part 103, when there is a magnetic field in an opposite direction to the direction in which the laser light L is transmitted through the cell 102, the polarization plane of the laser light L after transmission through the cell 102 rotates in an opposite direction to the rotation direction, the photocurrent of the polarized light L1 (polarized light L3) decreases, the photocurrent of the polarized light L2 (polarized light L4) increases, and the sign of the difference is minus (−). As described above, the orientation of the magnetic field is known by the sign of the difference. Note that, in the plus (+) sign or minus (−) sign, the absolute value of the difference indicates the magnitude (intensity) of the magnetic field.

The display unit 106 is a display device e.g. a liquid crystal display, and displays information representing the magnitude (intensity) and the orientation of the magnetic field calculated by the signal processing unit 105.

The control unit 107 electrically controls the respective parts of the magnetic field measuring apparatus 100. The control unit 107 has a processing unit such as a CPU and a memory. The magnetic field measuring apparatus 100 may include an input device such as a keyboard or touch screen (not shown).

Note that, in the embodiment, the configuration in which each of the two magnetic sensors has the light irradiation part 101 is employed, however, not limited to that. A configuration that guides a laser light L output from a single light irradiation part 101 to the first cell 102A and the second cell 102B may be employed. In other words, the magnetic sensor maybe treated as a sensor not including the light irradiation part 101.

Principle of Magnetic Field Measuring Method

Figure 2:
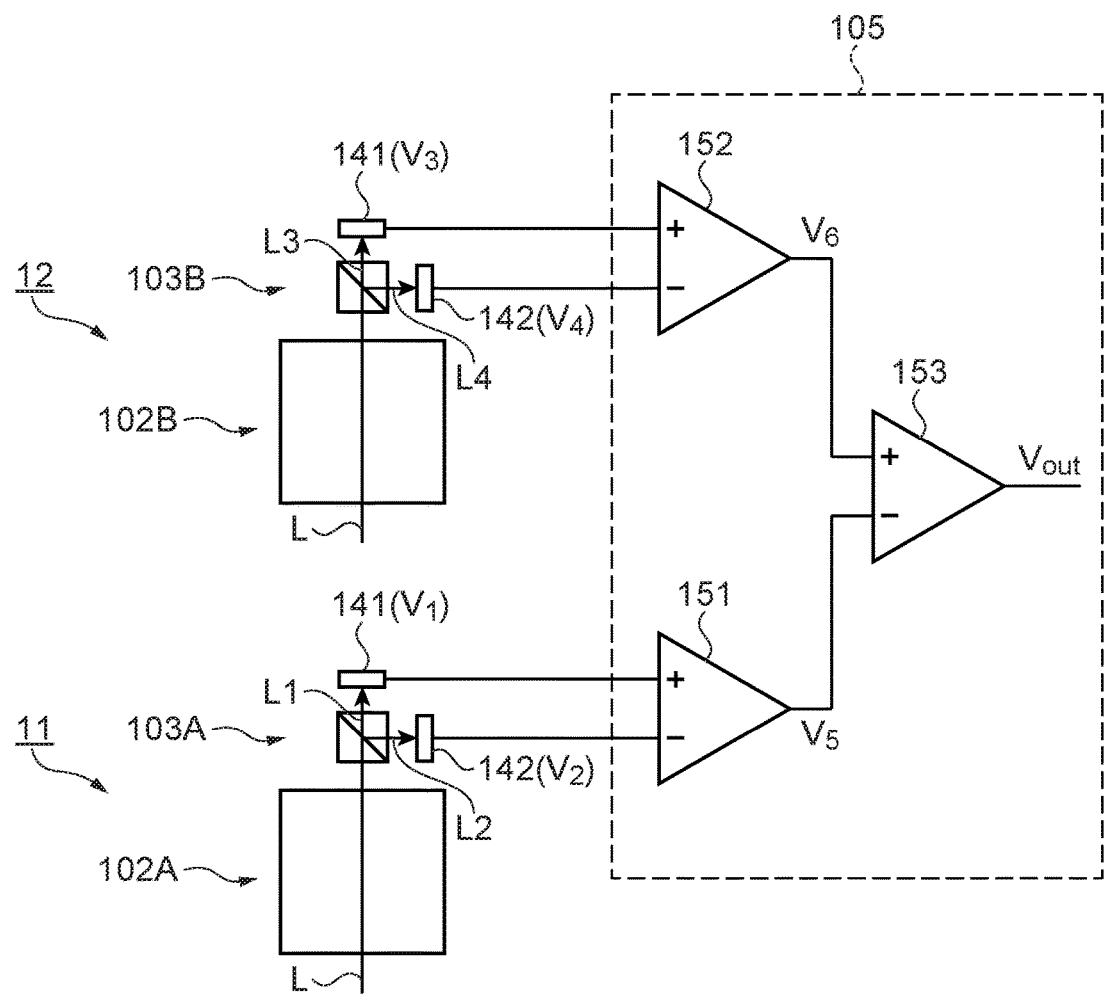
FIG. 2 is a schematic view showing an arrangement of two magnetic sensors.
Figure 3:
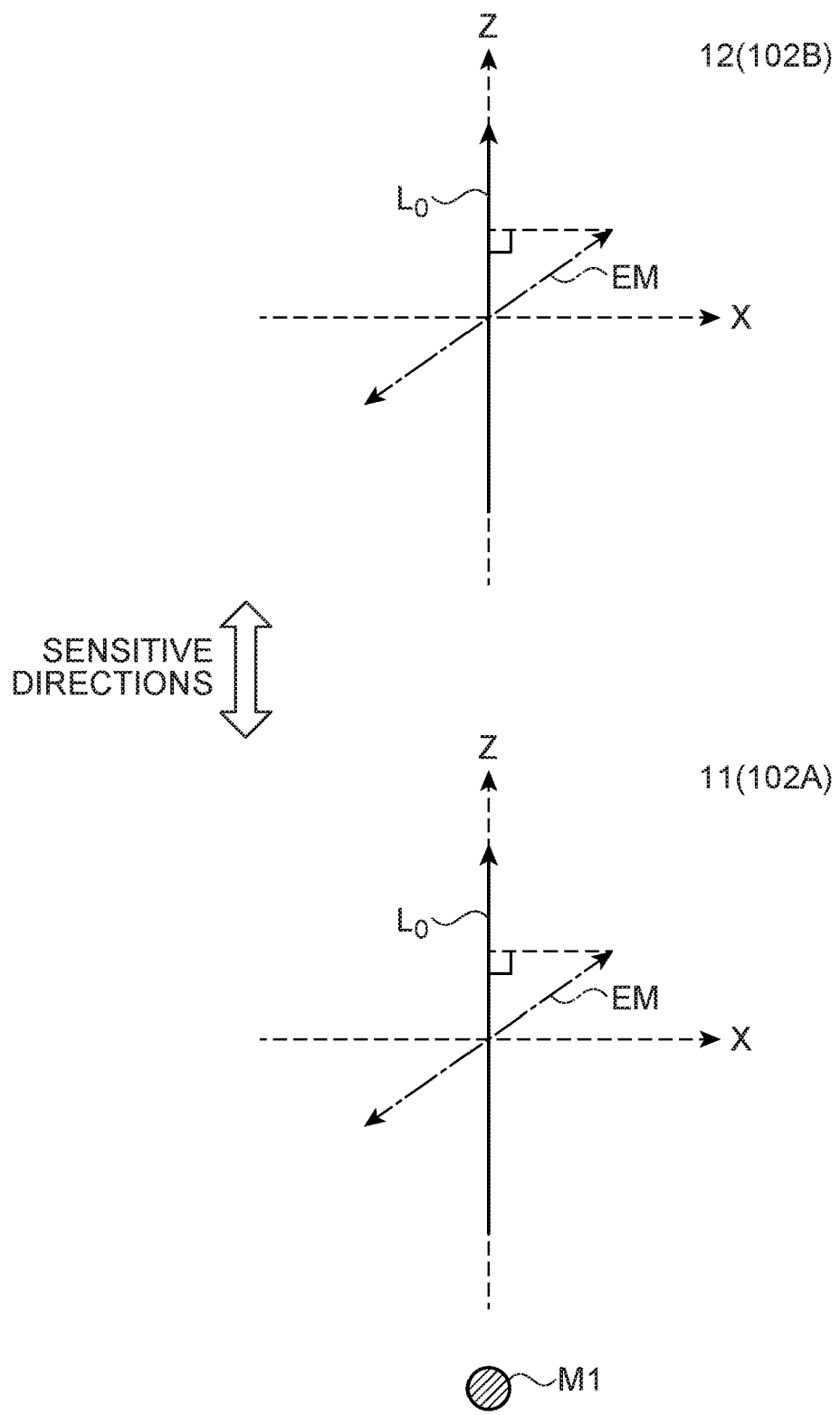
FIG. 3 shows relationships between laser optical axes and external magnetic fields in the two magnetic sensors.
Figure 4:
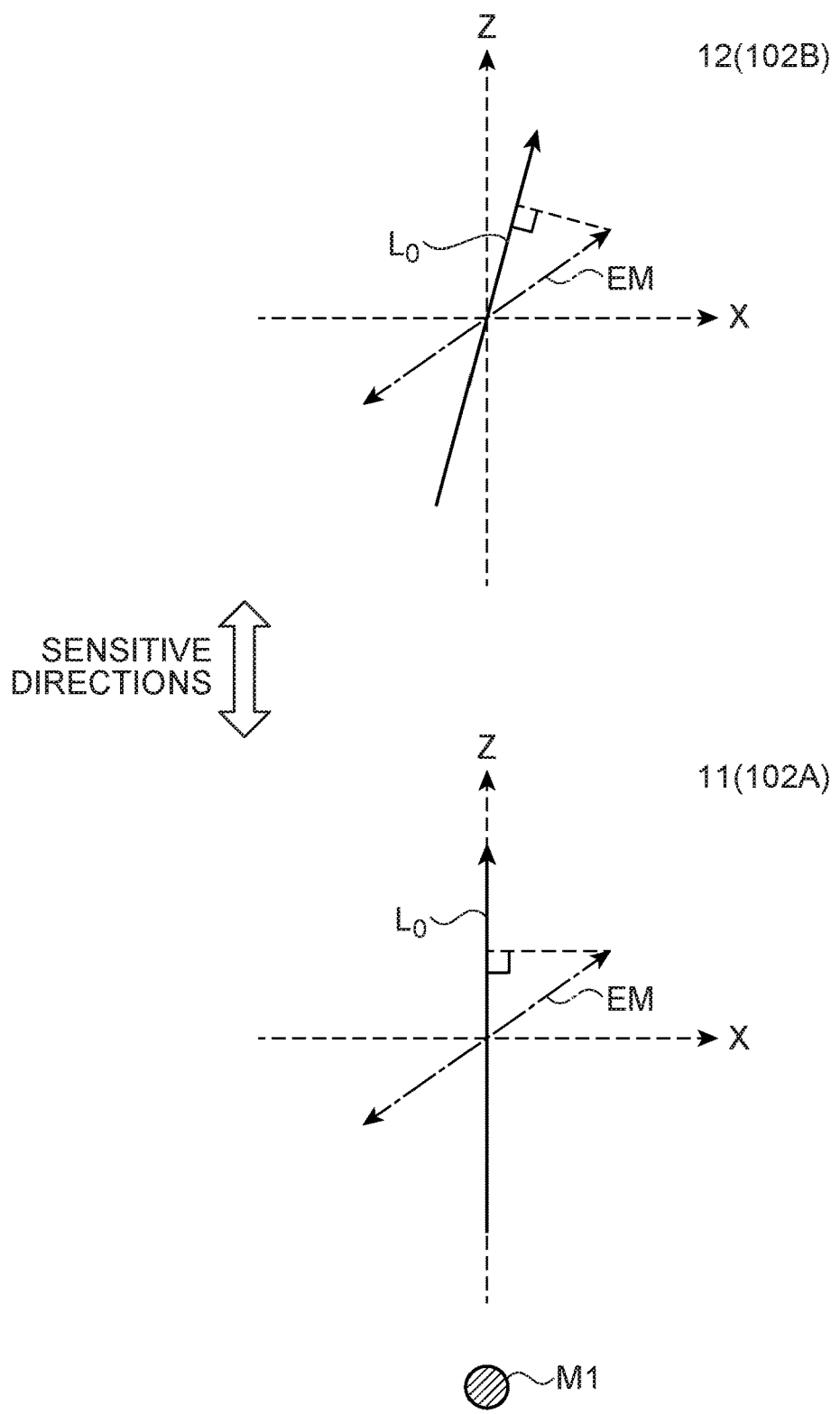
FIG. 4 shows relationships between laser optical axes and external magnetic fields in the two magnetic sensors.

Next, the principle of a magnetic field measuring method using the magnetic field measuring apparatus 100 will be explained using FIGS. 2 and 4. FIG. 2 is a schematic view showing an arrangement of the two magnetic sensors. FIGS. 3 and 4 show relationships between laser optical axes and external magnetic fields in the two magnetic sensors. Hereinafter, the measurement magnetic sensor 11 and the reference magnetic sensor 12 maybe referred to as "two magnetic sensors 11, 12".

For explanation of the arrangement of the two magnetic sensors 11, 12, as shown in FIG. 2, orthogonal coordinates of an X-axis, a Y-axis, and a Z-axis orthogonal to one another are used. In the two magnetic sensors 11, 12, for example, in the Z-axis directions, the first cell 102A is placed on the side closer to a magnetic field source M1 and the second cell 102B is placed on the side farther from the magnetic field source M1 than the first cell 102A. Note that the directions in which the two magnetic sensors 11, 12 are placed with respect to the magnetic field source M1 are not limited to the Z-axis directions.

The laser light L enters the respective first cell 102A and second cell 102B along the Z-axis directions. As described above, the laser light L transmitted through the first cell 102A is split into polarized light L1 and polarized light L2 by the first polarization separating part 103A, and the polarized light L1 enters the light receiving element 141 and the polarized light L2 enters the light receiving element 142. On the other hand, the laser light L transmitted through the second cell 102B is split into polarized light L3 and polarized light L4 by the second polarization separating part 103B, and the polarized light L3 enters the light receiving element 141 and the polarized light L4 enters the light receiving element 142.

As shown in FIG. 3, the magnetic field source M1, the first cell 102A, and the second cell 102B are placed in the order in the Z-axis directions and a laser optical axis $L_O$ of the laser light L is also along the Z-axis directions, and the sensitive directions in the magnetic field measuring apparatus 100 of the embodiment are directions along the Z-axis directions as shown by an arrow. In other words, the magnetic field source M1, the first cell 102A, and the second cell 102B are placed in the order in the sensitive directions.

It is known that the magnitudes of the magnetic field of the magnetic field source M1 measured by the two magnetic sensors 11, 12 are inversely proportional to the squares of the distances from the magnetic field source M1 to the respective magnetic sensors (Bio-Savart law). Therefore, the magnitude of the magnetic field of the magnetic field source M1 measured by the measurement magnetic sensor 11 is larger than the magnitude of the magnetic field of the magnetic field source M1 measured by the reference magnetic sensor 12 placed in the position farther from the magnetic field source M1 than the measurement magnetic sensor 11. In other words, the magnitude of the magnetic field of the magnetic field source M1 measured by the reference magnetic sensor 12 is smaller than the magnitude of the magnetic field of the magnetic field source M1 measured by the measurement magnetic sensor 11 placed in the position closer to from the magnetic field source M1 than the reference magnetic sensor 12.

On the other hand, for example, as shown in FIG. 3, it is assumed that, in the coordinates shown by the X-axis and the Z-axis, an external magnetic field EM containing an environment magnetic field such as geomagnetism acts in oblique directions crossing the X-axis and the Z-axis. The external magnetic fields EM having the same magnitude in the same directions are applied to the respective two magnetic sensors 11, 12 placed in the different positions in the Z-axis directions.

The magnitude of the external magnetic field EM is generally at an nT (nanotesla) level, while the magnitude of a magnetic field generated from a magnetic field source M1 e.g. a heart, brain, or the like in a living body is at a pT (picotesla) level. Therefore, the magnetic field measurement of the magnetic field source M1 is affected by noise of the external magnetic field EM larger than the magnitude of the magnetic field generated from the magnetic field source M1.

In the magnetic field measuring apparatus 100 of the embodiment, the magnetic field measurement method can eliminate the influence (noise) of the external magnetic field EM. Specifically, as shown in FIG. 2, in the measurement magnetic sensor 11, the light receiving element 141 receives the polarized light L1 and outputs a potential $V_1$ and the light receiving element 142 receives the polarized light L2 and outputs a potential $V_2$. Similarly, in the reference magnetic sensor 12, the light receiving element 141 receives the polarized light L3 and outputs a potential $V_3$ and the light receiving element 142 receives the polarized light L4 and outputs a potential $V_4$.

The signal processing unit 105 has e.g. three operational amplifier parts 151, 152, 153. The difference between the potential $V_1$ and the potential $V_2$ is calculated and a potential $V_5$ is output by the operational amplifier part 151. The difference between the potential $V_3$ and the potential $V_4$ is calculated and a potential $V_6$ is output by the operational amplifier part 152. The difference between the potential $V_5$ and the potential $V_6$ is calculated and a potential $V_{out}$ is output by the operational amplifier part 153.

The potential $V_5$ electrically indicates the magnitude of the magnetic field of the magnetic field source M1 containing the noise of the external magnetic field EM sensed by the measurement magnetic sensor 11, and, similarly, the potential $V_6$ electrically indicates the magnitude of the magnetic field of the magnetic field source M1 containing the noise of the external magnetic field EM sensed by the reference magnetic sensor 12. As shown in FIG. 3, the directions and magnitudes of the external magnetic fields EM applied to the two magnetic sensors 11, 12 are the same, and the noise of the external magnetic fields EM may be eliminated by the calculation of the difference between the potential $V_5$ and the potential $V_6$. Further, the magnetic fields generated from the magnetic field source M1 are inversely proportional to the distances from the magnetic field source M1 to the magnetic sensors, and thereby, the magnitude of the magnetic field of the magnetic field source M1 sensed by the reference magnetic sensor 12 is especially smaller than the magnitude of the magnetic field of the magnetic field source M1 sensed by the measurement magnetic sensor 11 and the magnitude of the magnetic field of the magnetic field source M1 sensed by the reference magnetic sensor 12 may be regarded as "zero". Thus, the noise of the external magnetic fields EM may be eliminated by the calculation of the difference between the potential $V_5$ and the potential $V_6$, and the magnitude of the magnetic field of the magnetic field source M1 sensed by the measurement magnetic sensor 11 may be electrically extracted as the potential $V_{out}$.

However, as shown in FIG. 4, for example, in the case where the incident direction of the laser light L in the second cell 102B of the reference magnetic sensor 12, i.e., the direction of the laser optical axis $L_O$ shifts from the Z-axis direction, the magnitude of the noise of the external magnetic field EM sensed by the reference magnetic sensor 12 differs from the magnitude of the noise of the external magnetic field EM sensed by the measurement magnetic sensor 11 from the relationship with the rotation angle of the polarization plane of the laser light L. Therefore, even when the difference between the potential $V_5$ and the potential $V_6$ is calculated, the noise of the external magnetic fields EM is not properly eliminated. The defect may be similarly caused in the case where the direction of the laser optical axis $L_O$ in the first cell 102A of the measurement magnetic sensor 11 shifts from the Z-axis direction. That is, the incident directions of the laser light L (the orientation of the laser optical axis $L_O$) to the first cell 102A and the second cell 102B are required to be the same. Accordingly, the magnetic field measuring apparatus 100 of the embodiment has a configuration that can eliminate the above described defect and will be explained with reference to FIG. 5.

Figure 5:
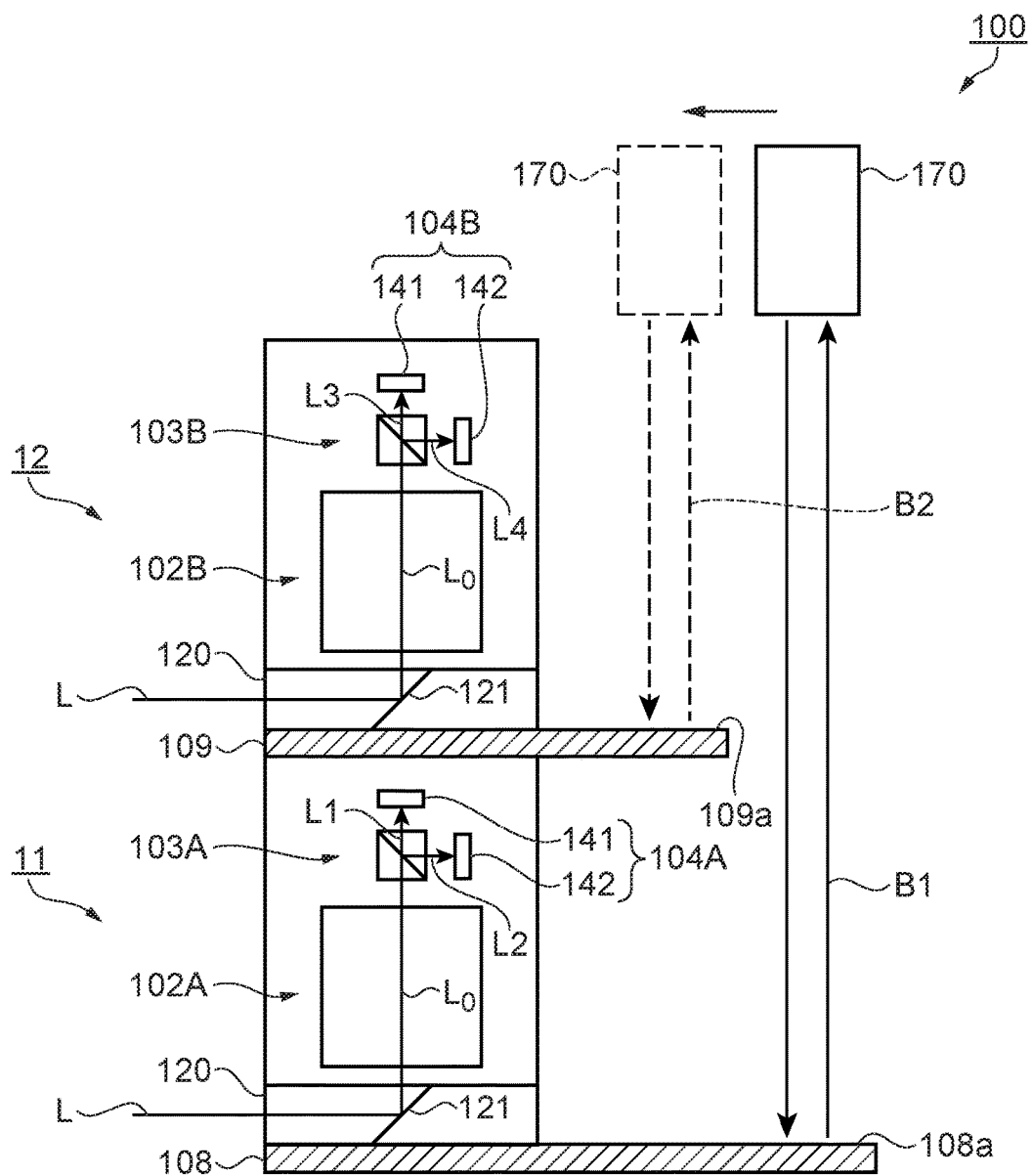
FIG. 5 is a schematic view showing a configuration of the magnetic field measuring apparatus of the first embodiment.

FIG. 5 is a schematic view showing a configuration of the magnetic field measuring apparatus of the first embodiment. Specifically, FIG. 5 is the schematic view showing the configuration of the magnetic field measuring apparatus 100 as seen from the Y-axis direction orthogonal to the Z-axis direction.

As shown in FIG. 5, the magnetic field measuring apparatus 100 has a first supporting unit 108 that supports the first cell 102A, the first polarization separating part 103A, and the light receiving elements 141, 142 of the measurement magnetic sensor 11. Similarly, the apparatus has a second supporting unit 109 that supports the second cell 102B, the second polarization separating part 103B, and the light receiving elements 141, 142 of the reference magnetic sensor 12. Though the detailed illustration is omitted, the respective first supporting unit 108 and second supporting unit 109 are structures that can sterically support the above described respective parts. In the first supporting unit 108, a surface on the first cell 102A side in the bottom part of the structure is set as a first reference surface 108a. Similarly, in the second supporting unit 109, a surface on the second cell 102B side in the bottom part of the structure is set as a second reference surface 109a.

In the embodiment, the area of the first reference surface 108a is larger than the area of the second reference surface 109a, and, when the second supporting unit 109 is superimposed on the first supporting unit 108 in a predetermined position, in the plan view along the Z-axis directions, a part of the first reference surface 108a protrudes from the second reference surface 109a in the X-axis direction.

A light guide 120 as a first optical device that enters the laser light L output from the first light irradiation part 101A into the first cell 102A from the Z-axis direction is placed between the first reference surface 108a and the first cell 102A. The light guide 120 has a mirror 121 that totally reflects and enters the incident laser light L into the first cell 102A.

A light guide 120 is also placed between the second reference surface 109a and the second cell 102B, and the light guide 120 functions as a second optical device that enters the laser light L output from the second light irradiation part 101B into the second cell 102B from the Z-axis direction. That is, the light guides 120 are placed on the respective first reference surface 108a and second reference surface 109a.

Note that a heating part (not shown) in FIG. 5 for adjusting the temperature of the first cell 102A to a temperature suitable for magnetic field measurement is provided between the light guide 120 and the first cell 102A on the first reference surface 108a. The heating part is e.g. a plate-like ceramic heater and placed not to hinder the incidence of the laser light L to the first cell 102A. Similarly, a heating part is provided between the light guide 120 and the second cell 102B on the second reference surface 109a.

The magnetic field measuring apparatus 100 includes a laser autocollimator 170 as an example of an optical axis detection part. The laser autocollimator 170 includes a light source that irradiates a measuring object with beam light and a light receiving device such as a CCD that detects the beam light (reflected light) reflected by the surface of the measuring object. The laser autocollimator 170 may detect the orientation of the optical axis of the beam light reflected by the surface of the measuring object. In the embodiment, the laser autocollimator 170 is provided to be relatively movable at least in the X-axis directions with respect to the first supporting unit 108 and the second supporting unit 109 to be able to irradiate the respective first reference surface 108a and second reference surface 109a with the beam light in the Z-axis directions. That is, the beam light radiated to the first reference surface 108a and the beam light radiated to the second reference surface 109a are parallel to each other along the Z-axis directions.

As shown in FIG. 5, in the magnetic field measuring apparatus 100 of the embodiment, the orientation of an optical axis of a beam light B1 reflected by the first reference surface 108a and the orientation of an optical axis of a beam light B2 reflected by the second reference surface 109a are detected using the laser autocollimator 170. The magnetic field measuring apparatus 100 includes a position adjustment mechanism that can adjust the relative position of the second reference surface 109a to the first reference surface 108a. By the position adjustment mechanism, the relative position of the second reference surface 109a to the first reference surface 108a may be adjusted based on the detection result of the laser autocollimator 170. The position adjustment mechanism may be adapted to automatically adjust the relative position of the second reference surface 109a to the first reference surface 108a by the control unit 107 referring to the detection result of the laser autocollimator 170, or the position adjustment mechanism may be adapted to adjust the relative position of the second reference surface 109a to the first reference surface 108a by the display unit 106 displaying the detection result of the laser autocollimator 170 and an operator confirming the display.

In FIG. 5, the position adjustment mechanism is not specifically shown, however, any mechanism that can adjust the position of the second reference surface 109a with respect to the first reference surface 108a in the X-axis directions, Y-axis directions, and Z-axis directions and can adjust the inclinations with respect to the X-axis, Y-axis, and Z-axis maybe employed. It is preferable not to apply a material that affects magnetic field measurement to the position adjustment mechanism.

The manufacturing method of the magnetic field measuring apparatus 100 of the embodiment includes a position adjustment step of adjusting the position of the second reference surface 109a with respect to the first reference surface 108a. As below, the manufacturing method of the magnetic field measuring apparatus 100 will be explained.

Manufacturing Method of Magnetic Field Measuring Apparatus

The manufacturing method of the magnetic field measuring apparatus 100 of the embodiment includes a placement step of sequentially placing the first cell 102A and the second cell 102B in the sensitive directions of the magnetic field (step S1), an optical axis detection step of detecting the orientation of the optical axis of the beam light B1 as a first reflected light of the beam light relating to the first reference surface 108a and the orientation of the optical axis of the beam light B2 as a second reflected light of the beam light relating to the second reference surface 109a (step S2), and the position adjustment step of adjusting the position of the second reference surface 109a with respect to the first reference surface 108a, in other words, the position of the second supporting unit 109 with respect to the first supporting unit 108 based on a result of the optical axis detection step (step S3). As below, the explanation will be made with reference to FIGS. 5 and 6.

As shown in FIG. 5, the placement step of step S1 in the embodiment is specifically a step of placing the second supporting unit 109 in which the reference magnetic sensor 12 has been incorporated on the first supporting unit 108 in which the measurement magnetic sensor 11 has been incorporated in the Z-axis directions. Here, the second supporting unit 109 is temporarily fixed in a predetermined position with respect to the first supporting unit 108. Then, the process moves to step S2.

The optical axis detection step of step S2 includes a first step of detecting the orientation of the optical axis of the beam light B1 and a second step of detecting the orientation of the optical axis of the beam light B2.

Figure 6:
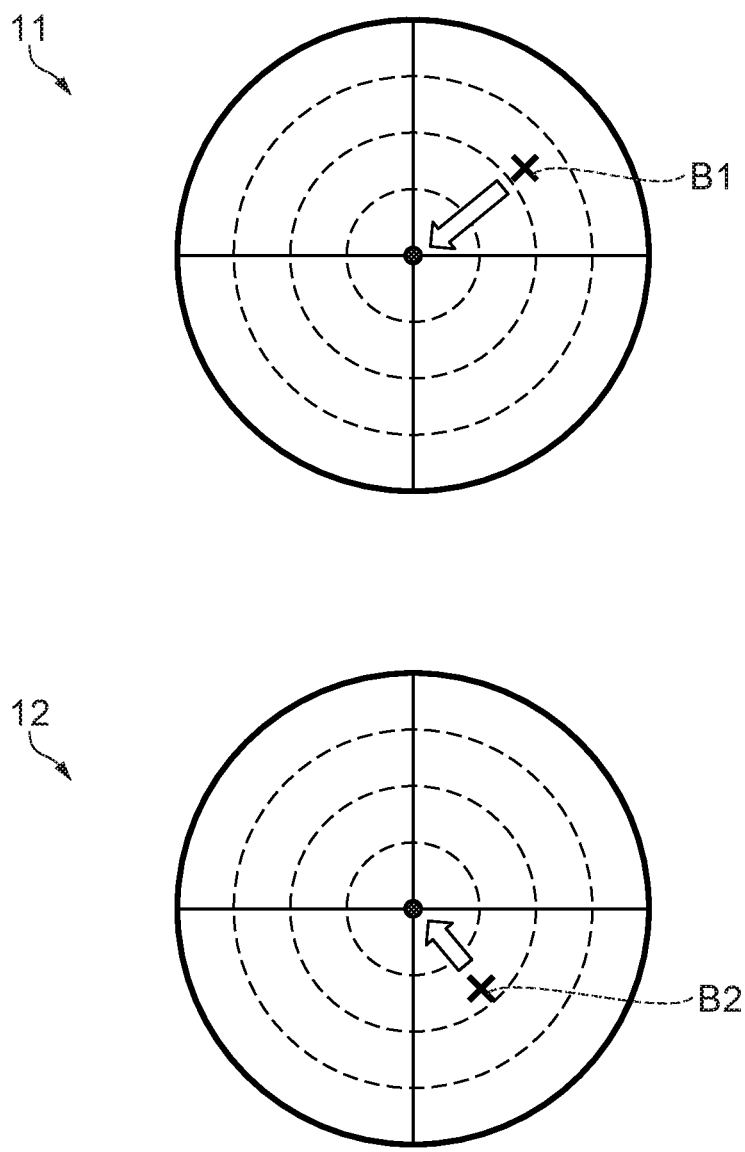
FIG. 6 shows an example of a detection result of an orientation of an optical axis of a first reflected light and an example of a detection result of an orientation of an optical axis of a second reflected light.

FIG. 6 shows an example of the detection result of the orientation of the optical axis of the first reflected light and an example of the detection result of the orientation of the optical axis of the second reflected light. Concentric circles shown in FIG. 6 show coordinates of the detected optical axis using the center of the concentric circles as a reference point. The reference point as the center of the concentric circles indicates the coordinates when the radiated beam light is reflected and returned straight in the direction of radiation. That is, the coordinates of the detected optical axis indicate the direction and the angle of the optical axis as the orientation of the optical axis with respect to the reference point.

At the first step of step S2, as shown in FIG. 5, the beam light is radiated from the laser autocollimator 170 toward the first reference surface 108a, and the orientation of the optical axis of the beam light B1 as the first reflected light reflected by the first reference surface 108a is detected. In FIG. 6, the detected orientation (coordinates) of the optical axis of the beam light B1 is shown by "x" mark. Here, as shown in FIG. 6, when the orientation (coordinates) of the optical axis of the beam light B1 largely shifts from the reference point, the position of the measurement magnetic sensor 11 in the first supporting unit 108 is adjusted so that the orientation (coordinates) of the optical axis of the beam light B1 and the reference point may coincide. Specifically, the adjustment of the relative positions of the light guide 120, first cell 102A, first polarization separating part 103A, and first light receiving part 104A (light receiving elements 141, 142) with respect to the first reference surface 108a is made. The detection of the orientation (coordinates) of the optical axis of the beam light B1 is repeatedly performed until the adjustment on the first supporting unit 108 side ends. When the adjustment on the first supporting unit 108 side ends, the adjusted orientation (coordinates) of the optical axis of the beam light B1 is reset as the reference point in the laser autocollimator 170. Note that it is not necessary that the orientation (coordinates) of the optical axis of the beam light B1 and the reference point strictly coincide. If the relative position relationship with each other is within a predetermined range, they may be treated as nearly a coincidence.

At the second step of step S2, as shown in FIG. 5, the laser autocollimator 170 is relatively moved in the X-axis directions and the beam light is radiated from the laser autocollimator 170 that has been reset with the orientation (coordinates) of the optical axis of the beam light B1 as the reference point toward the second reference surface 109a, and the orientation (coordinates) of the optical axis of the beam light B2 reflected by the second reference surface 109a is detected. In FIG. 6, the orientation (coordinates) of the optical axis of the beam light B2 is shown by "x" mark. Then, the process moves to step S3.

At the position adjustment step of step S3, at the second step of step S2, as shown in FIG. 6, when the orientation (coordinates) of the optical axis of the beam light B2 shifts from the reset reference point, the position of the second supporting unit 109 with respect to the first supporting unit 108 is adjusted using the above described position adjustment mechanism so that the orientation (coordinates) of the optical axis of the beam light B2 and the reference point may coincide. That is, the position of the second supporting unit 109 with respect to the first supporting unit 108 is adjusted so that the orientation of the optical axis of the beam light B1 and the orientation of the optical axis of the beam light B2 may be the same direction. The detection of the orientation (coordinates) of the optical axis of the beam light B2 is repeatedly performed until the adjustment on the second supporting unit 109 side ends.

The orientation of the optical axis of the beam light B1 relating to the first reference surface 108a is basically the same direction as the orientation of the laser optical axis $L_0$ in the first cell 102A. Further, the orientation of the optical axis of the beam light B2 relating to the second reference surface 109a is basically the same direction as the orientation of the laser optical axis $L_0$ in the second cell 102B. Therefore, at the position adjustment step, the adjustment is made so that the reference point and the orientation of the optical axis of the beam light B2 may coincide with the orientation of the optical axis of the beam light B1 as reference (reference point), and thereby, the orientation of the laser optical axis $L_0$ in the first cell 102A and the orientation of the laser optical axis $L_0$ in the second cell 102B may be made the same direction.

Note that, in the case where the difference between the orientation of the laser optical axis $L_0$ in the first cell 102A and the orientation of the laser optical axis $L_0$ in the second cell 102B is regarded as optical axis angle accuracy, the optical axis angle measurement resolution in the laser autocollimator 170 is required to be equal to the above described optical axis angle accuracy or smaller than the above described optical axis angle accuracy.

According to the magnetic field measuring apparatus 100 of the first embodiment and the manufacturing method thereof, the following advantages are obtained.

(1) The magnetic field measuring apparatus 100 has the first reference surface 108a provided in the first supporting unit 108 in which the measurement magnetic sensor 11 is incorporated, and the second reference surface 109a provided in the second supporting unit 109 in which the reference magnetic sensor 12 is incorporated. Further, the apparatus includes the laser autocollimator 170 as the optical axis detection part that can radiate the beam light to the respective first reference surface 108a and second reference surface 109a in the sensitive directions (Z-axis directions). Furthermore, the apparatus includes the position adjustment mechanism that can adjust the position of the second supporting unit 109 with respect to the first supporting unit 108. In the manufacturing method of the magnetic field measuring apparatus 100, at the optical axis detection step (step S2), the orientation of the optical axis of the beam light B1 as the first reflected light of the beam light relating to the first reference surface 108a and the orientation of the optical axis of the beam light B2 as the second reflected light of the beam light relating to the second reference surface 109a are detected by the laser autocollimator 170. At the position adjustment step (step S3), the position of the second supporting unit 109 with respect to the first supporting unit 108 is adjusted so that the orientation of the optical axis of the beam light B1 and the orientation of the optical axis of the beam light B2 may coincide, that is, the orientations of the laser optical axes $L_0$ in the first cell 102A and the second cell 102B (incident directions of the laser light L) may be the same direction. Therefore, in the measurement magnetic sensor 11 and the reference magnetic sensor 12 placed in the sensitive directions, the noise of the external magnetic fields EM is sensed at the same level, and the influence (noise) of the external magnetic fields EM may be properly eliminated by the calculation of the difference between the output of the first light receiving part 104A and the output of the second light receiving part 104B by the signal processing unit 105. Thus, the gradio-type magnetic field measuring apparatus 100 that can properly eliminate the influence (noise) of the external magnetic fields EM and accurately measure the magnetic field of the magnetic field source M1 by the measurement magnetic sensor 11 and the manufacturing method thereof may be provided.

(2) The optical axis detection step (step S2) has the first step of detecting the orientation of the optical axis of the beam light B1 as the first reflected light of the beam light relating to the first reference surface 108a and the second step of detecting the orientation of the optical axis of the beam light B2 as the second reflected light of the beam light relating to the second reference surface 109a. The second step is performed after the placement step (step S1) of placing the first supporting unit 108 in which the measurement magnetic sensor 11 has been incorporated and the second supporting unit 109 in which the reference magnetic sensor 12 has been incorporated to overlap in the sensitive directions, and detects the orientation of the optical axis of the beam light B2 with reference to the orientation of the optical axis of the beam light B1 detected at the first step. Therefore, at the position adjustment step, the position of the second reference surface 109a with respect to the first reference surface 108a may be easily adjusted using the detection result of the second step. That is, in the respective two magnetic sensors 11, 12, the orientations of the laser optical axes $L_O$ in the first cell 102A and the second cell 102B may be adjusted more easily than in the case where the orientations of the laser optical axes $L_O$ are individually adjusted and the placement step is performed.

Next, magnetic field measuring apparatuses of the other embodiments will be explained with reference to the drawings.

Second Embodiment

Figure 7:
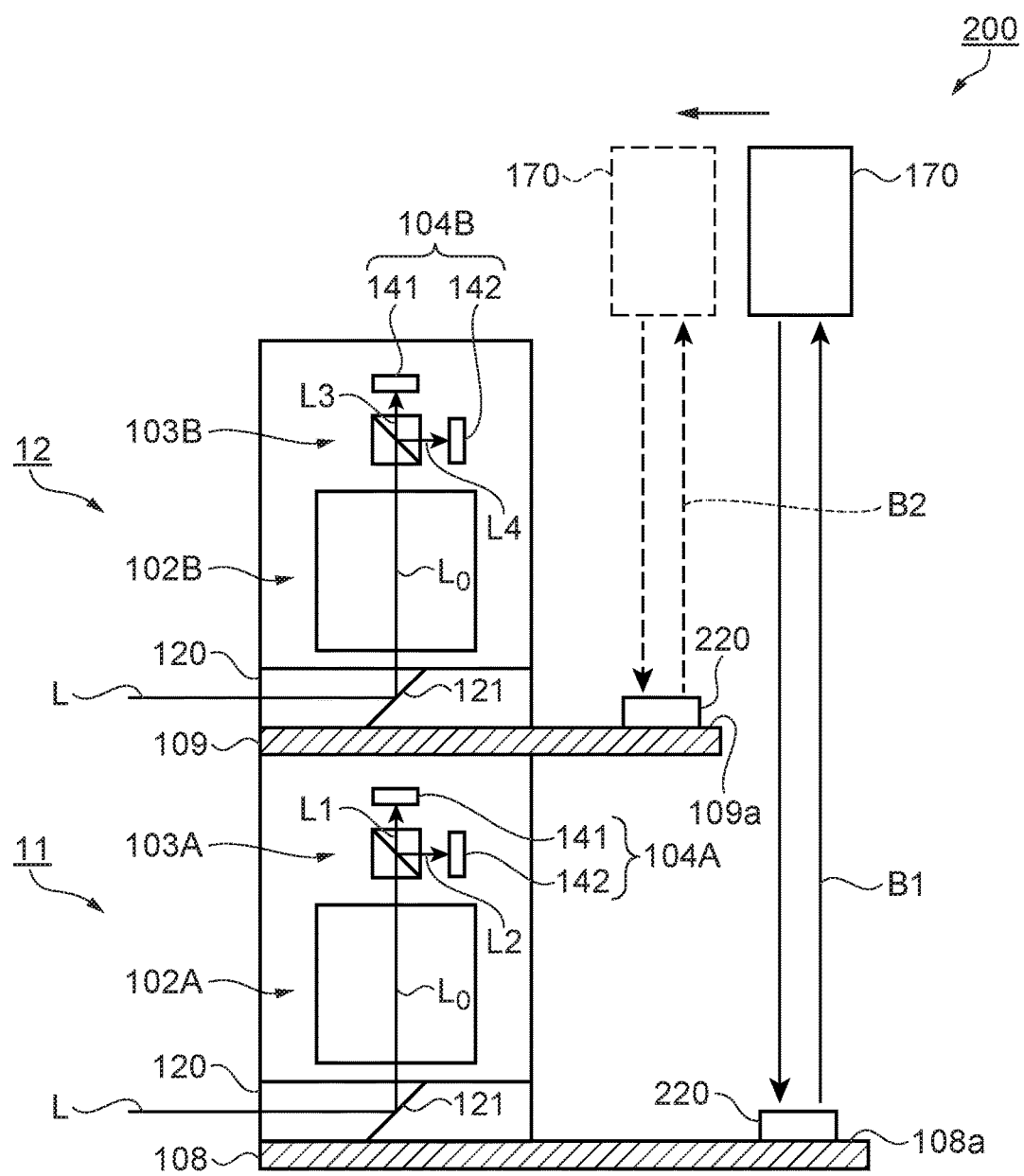
FIG. 7 is a schematic view showing a configuration of a magnetic field measuring apparatus of the second embodiment.

FIG. 7 is a schematic view showing a configuration of a magnetic field measuring apparatus of the second embodiment. Specifically, FIG. 7 corresponds to FIG. 5 in the above described first embodiment. In the magnetic field measuring apparatus of the second embodiment, the same configurations as those of the magnetic field measuring apparatus 100 of the first embodiment have the same signs and their detailed explanation will be omitted. Further, the magnetic field measuring apparatus of the second embodiment basically has the gradio-type configuration shown in FIGS. 1 and 2 of the above described first embodiment.

As shown in FIG. 7, the magnetic field measuring apparatus 200 of the embodiment has a first supporting unit 108 in which a measurement magnetic sensor 11 is incorporated, and a second supporting unit 109 in which a reference magnetic sensor 12 is incorporated. The first supporting unit 108 and the second supporting unit 109 are placed to overlap in the sensitive directions (Z-axis directions). A surface on a first cell 102A side in the bottom part of the first supporting unit 108 as a structure is set as a first reference surface 108a. Similarly, a surface on a second cell 102B side in the bottom part of the second supporting unit 109 as a structure is set as a second reference surface 109a.

A laser autocollimator 170 that can radiate beam light toward the respective first reference surface 108a and second reference surface 109a in the sensitive directions is provided. Further, optical flats 220 as reflection members are placed on the first reference surface 108a and second reference surface 109a. In other words, the laser autocollimator 170 is provided to be able to approach the optical flats 220 provided on the respective first reference surface 108a and second reference surface 109a from the sensitive direction (Z-axis direction).

For example, a transparent substrate of quartz crystal is used for the optical flat 220, and at least one face of the transparent substrate is planarized with optically high accuracy. The surface roughness of the at least one face is e.g. 30 nm to 60 nm in PV (peak-to-valley) value. The optical flats 220 are placed on the first reference surface 108a and the second reference surface 109a so that the planarized faces may face the laser autocollimator 170.

A manufacturing method of the magnetic field measuring apparatus 200 of the embodiment is basically the same as the manufacturing method of the magnetic field measuring apparatus 100 of the above described first embodiment, however, at the optical axis detection step, the beam light is radiated from the laser autocollimator 170 toward the optical flat 220 provided on the first reference surface 108a, and the laser autocollimator 170 detects the orientation of the optical axis of a beam light B1 reflected by the optical flat 220. Similarly, the beam light is radiated from the laser autocollimator 170 toward the optical flat 220 provided on the second reference surface 109a, and the laser autocollimator 170 detects the orientation of the optical axis of a beam light B2 reflected by the optical flat 220.

According to the configuration of the second embodiment, compared to the case where the optical flats 220 are not provided on the first reference surface 108a and the second reference surface 109a, the radiated beam lights may be reflected in stable directions by the optical flats 220, and the orientation of the optical axis of the beam light B1 relating to the first reference surface 108a and the orientation of the optical axis of the beam light B2 relating to the second reference surface 109a may be detected more correctly. In other words, the gradio-type magnetic field measuring apparatus 200 that can secure the optical axis angle accuracy in the two magnetic sensors 11, 12, properly eliminate the influence (noise) of the external magnetic fields EM, and accurately measure the magnetic field of the magnetic field source M1 by the measurement magnetic sensor 11 and the manufacturing method thereof may be provided.

Third Embodiment

Figure 8:
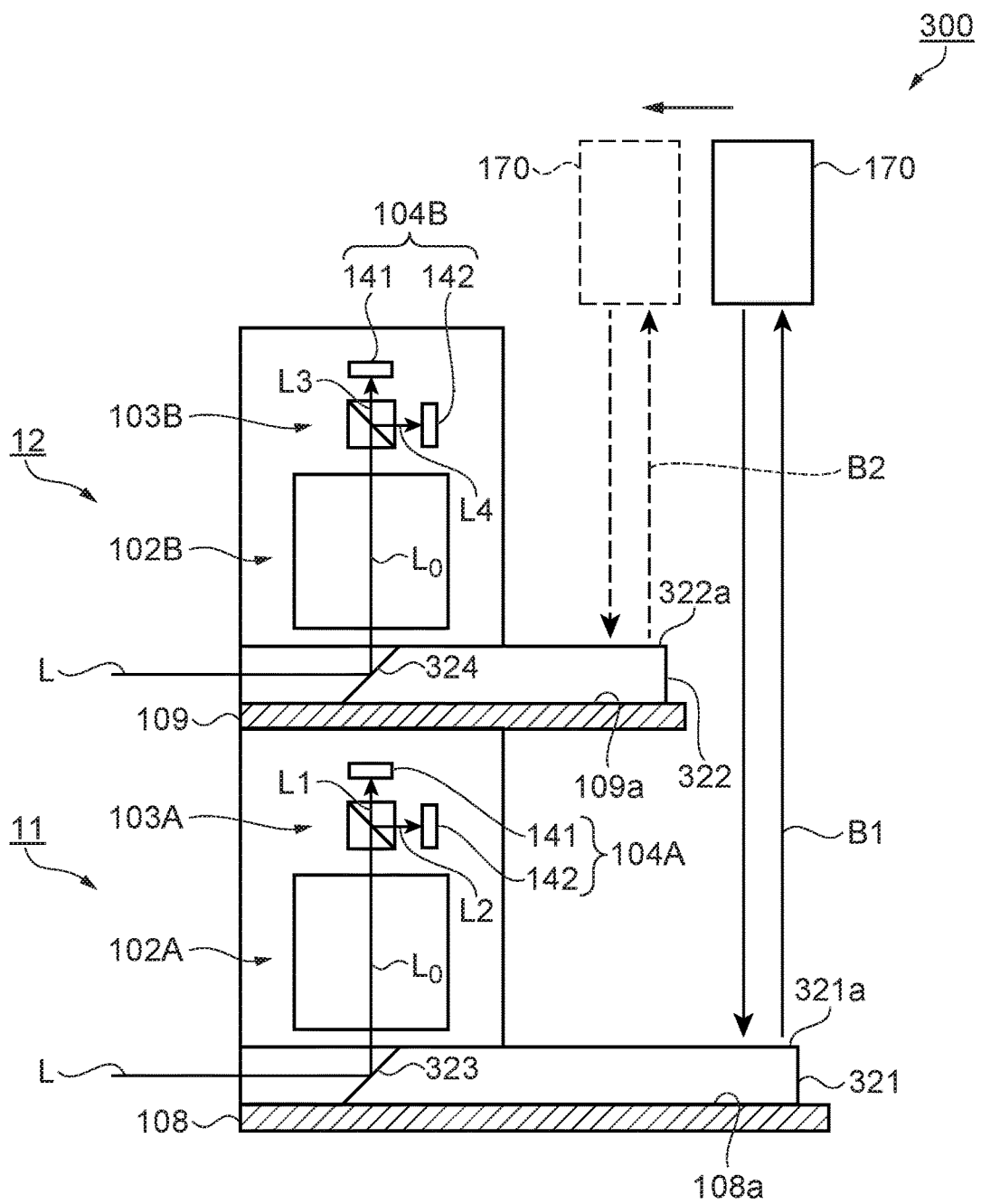
FIG. 8 is a schematic view showing a configuration of a magnetic field measuring apparatus of the third embodiment.

FIG. 8 is a schematic view showing a configuration of a magnetic field measuring apparatus of the third embodiment. Specifically, FIG. 8 corresponds to FIG. 5 in the above described first embodiment. In the magnetic field measuring apparatus of the third embodiment, the same configurations as those of the magnetic field measuring apparatus 100 of the first embodiment have the same signs and their detailed explanation will be omitted. Further, the magnetic field measuring apparatus of the third embodiment basically has the gradio-type configuration shown in FIGS. 1 and 2 of the above described first embodiment.

As shown in FIG. 8, the magnetic field measuring apparatus 300 of the embodiment has a first supporting unit 108 in which a measurement magnetic sensor 11 is incorporated, and a second supporting unit 109 in which a reference magnetic sensor 12 is incorporated. The first supporting unit 108 and the second supporting unit 109 are placed to overlap in the sensitive directions (Z-axis directions). A surface on a first cell 102A side in the bottom part of the first supporting unit 108 as a structure is set as a first reference surface 108a. Similarly, a surface on a second cell 102B side in the bottom part of the second supporting unit 109 as a structure is set as a second reference surface 109a.

A first light guide 321 as a first optical device that enters the laser light L output from a first light irradiation part 101A into a first cell 102A from the Z-axis direction is placed between the first reference surface 108a and the first cell 102A. The first light guide 321 has a mirror 323 that totally reflects and enters the incident laser light L into the first cell 102A.

A second light guide 322 as a second optical device that enters the laser light L output from a second light irradiation part 101B into a second cell 102B from the Z-axis direction is placed between the second reference surface 109a and the second cell 102B. The second light guide 322 has a mirror 324 that totally reflects and enters the incident laser light L into the second cell 102B.

The first light guide 321 is provided over the nearly entire surface of the first reference surface 108a. Similarly, the second light guide 322 is provided over the nearly entire surface of the second reference surface 109a. The area of the first light guide 321 in the plan view along the Z-axis directions is larger than the area of the second light guide 322.

A laser autocollimator 170 is provided to be able to approach the first light guide 321 provided on the first reference surface 108a and the second light guide 322 provided on the second reference surface 109a in the sensitive directions (Z-axis directions).

A manufacturing method of the magnetic field measuring apparatus 300 of the embodiment is basically the same as the manufacturing method of the magnetic field measuring apparatus 100 of the above described first embodiment, however, at the optical axis detection step, beam light is radiated from the laser autocollimator 170 toward one surface 321a of the first light guide 321 and the laser autocollimator 170 detects the orientation of an optical axis of a beam light B1 reflected by the one surface 321a. Similarly, beam light is radiated from the laser autocollimator 170 toward one surface 322a of the second light guide 322 and the laser autocollimator 170 detects the orientation of an optical axis of a beam light B2 reflected by the one surface 322a.

According to the magnetic field measuring apparatus 300 and the manufacturing method of the third embodiment, compared to the case where the beam lights are radiated from the laser autocollimator 170 directly to the first reference surface 108a and the second reference surface 109a, the radiated beam lights are reflected by the first light guide 321 and the second light guide 322 in more stable directions. Therefore, the orientation of the optical axis of the beam light B1 relating to the first reference surface 108a and the orientation of the optical axis of the beam light B2 relating to the second reference surface 109a may be detected more correctly. Further, compared to the magnetic field measuring apparatus 200 of the above described second embodiment, it is not necessary to provide the optical flats 220, and the configuration of the apparatus maybe simplified and the equal advantages as those in the above described second embodiment may be obtained.

The configurations of the above described second embodiment and the above described third embodiment are better than that of the above described first embodiment in that high flatness is not required for the first reference surface 108a and the second reference surface 109a.

"Reflected light of light relating to reference surface" in the invention is a technical idea including not only the reflected light directly reflected by the reference surface as shown in the above described first embodiment but also the reflected lights reflected by the surfaces of the reflection members and the light guides provided on the reference surfaces as shown in the above described second embodiment and the above described third embodiment. Further, for correct detection of the orientations of the optical axes of the reflected lights, it is preferable that the lights radiated to the reference surfaces are beam lights as parallel luminous fluxes.

Fourth Embodiment

Figure 9:
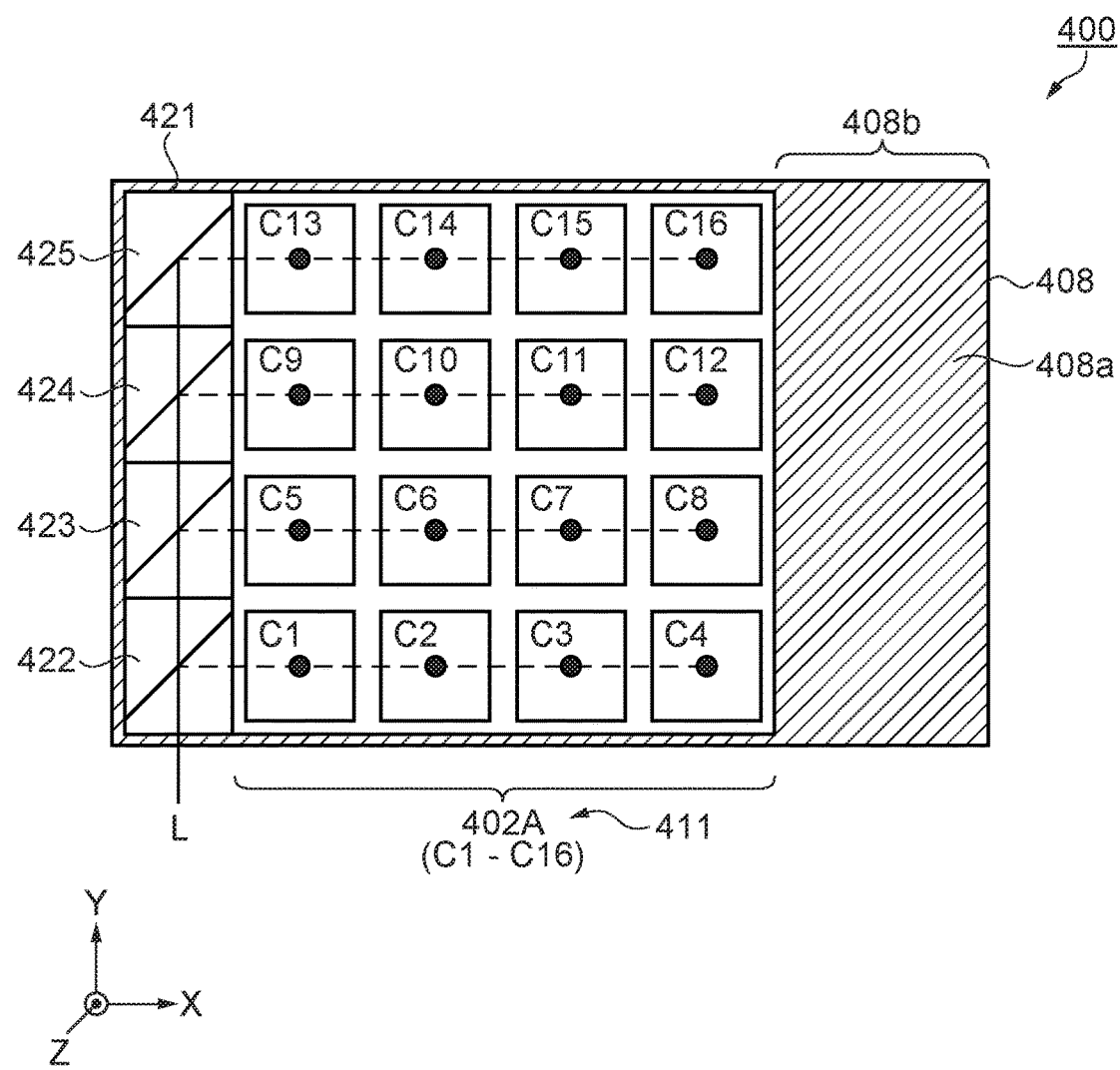
FIG. 9 is a schematic plan view showing an arrangement of cells in a magnetic field measuring apparatus of the fourth embodiment.
Figure 10:
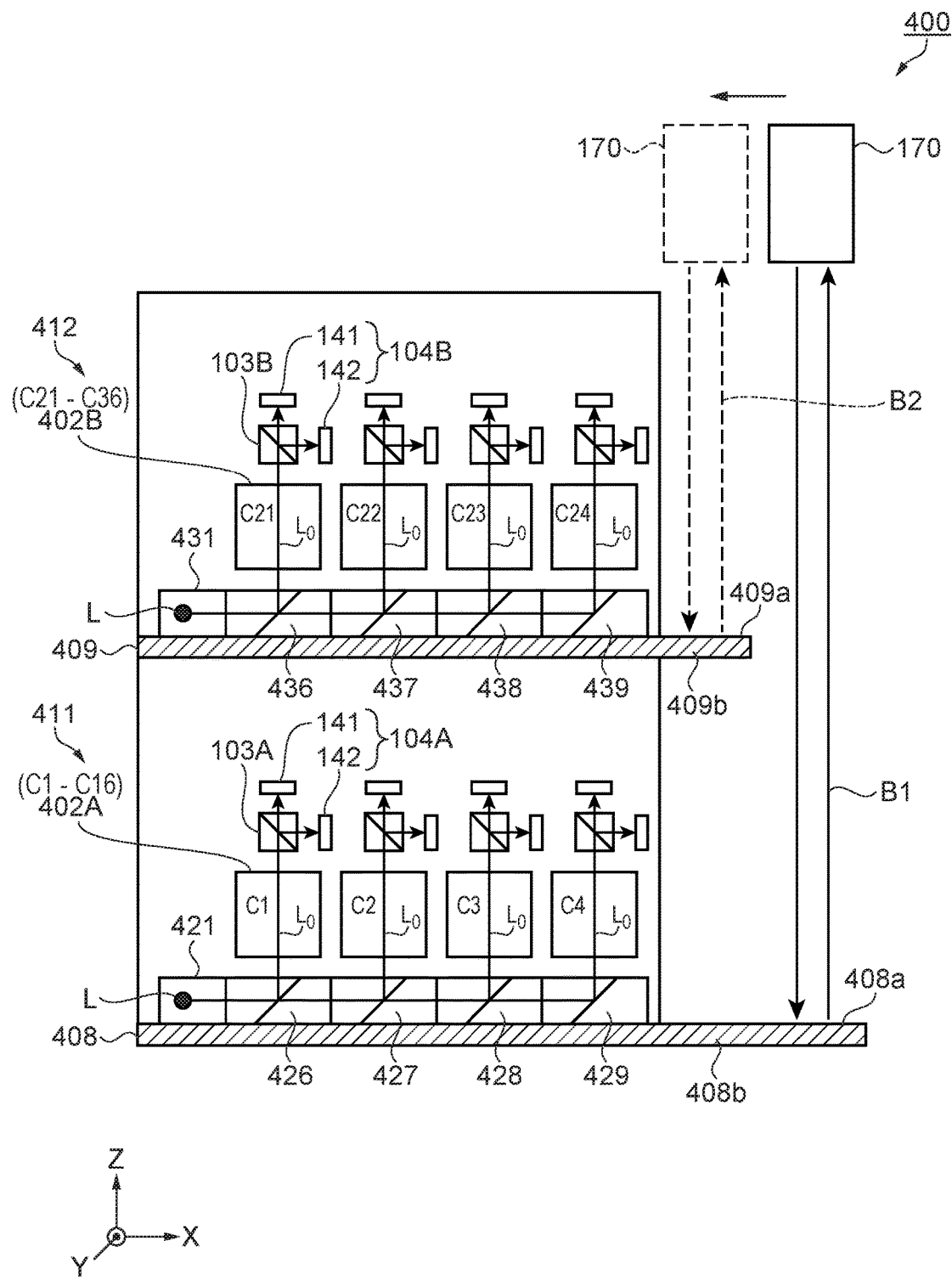
FIG. 10 is a schematic view showing a configuration of the magnetic field measuring apparatus of the fourth embodiment.

FIG. 9 is a schematic plan view showing an arrangement of cells in a magnetic field measuring apparatus of the fourth embodiment, and FIG. 10 is a schematic view showing a configuration of the magnetic field measuring apparatus of the fourth embodiment. Specifically, FIG. 10 corresponds to FIG. 5 in the above described first embodiment. In the magnetic field measuring apparatus of the fourth embodiment, the same configurations as those of the magnetic field measuring apparatus 100 of the first embodiment have the same signs and their detailed explanation will be omitted. Further, the magnetic field measuring apparatus of the fourth embodiment basically has the gradio-type configuration shown in FIGS. 1 and 2 of the above described first embodiment, and has multichannel-type measurement magnetic sensor and reference magnetic sensor.

FIG. 9 shows the arrangement of cells in the magnetic field measuring apparatus 400 of the embodiment, and specifically, shows the arrangement of cells in the plan view along the sensitive directions (Z-axis directions).

As shown in FIG. 9, the magnetic field measuring apparatus 400 of the embodiment has a measurement magnetic sensor 411. The measurement magnetic sensor 411 is of a multichannel-type including a cell array 402A of a plurality of cells. The magnetic field measuring apparatus 400 has a first optical device 421 that enters laser light L into the respective cells of the cell array 402A. Further, the magnetic field measuring apparatus 400 has a first supporting part 408 in which the measurement magnetic sensor 411 is incorporated.

The cell array 402A includes e.g. 16 cells from cell C1 to cell C16 arranged in a matrix form in the X-axis directions and the Y-axis directions. Note that the number of cells is not limited to that. In FIG. 9, the plurality of cells are arranged with gaps in the X-axis directions and the Y-axis directions, however, the adjacent cells may be arranged in close contact.

The first optical device 421 includes a plurality of non-polarizing beam splitters (NPBS) that guide the laser light L from the side of the cells arranged on one end toward the side of the cells arranged on the other end in the X-axis directions of the cell array 402A. Specifically, the first optical device 421 includes four NPBS 422, 423, 424, 425 arranged side by side in the Y-axis directions. Of the four NPBS 422, 423, 424, 425, the three NPBS 422, 423, 424 transmit part of the P-polarized light component of the incident laser light L and reflect the rest. The other one NPBS 425 totally reflects the incident P-polarized light component.

The laser light L enters the first optical device 421 along the Y-axis direction. First, part of the P-polarized light component of the laser light L entering the NPBS 422 is transmitted through the NPBS 422 and the P-polarized light component reflected by the NPBS 422 is guided to the cells C1 to C4 arranged in the X-axis directions. The P-polarized light component that has been guided to the cells C1 to C4 enters and is transmitted through the respective cells C1 to C4 from the Z-axis direction.

Part of the P-polarized light component transmitted through the NPBS 422 and entering the NPBS 423 is transmitted through the NPBS 423, and the P-polarized light component reflected by the NPBS 423 is guided to the cells C5 to C8 arranged in the X-axis directions. The P-polarized light component that has been guided to the cells C5 to C8 enters and is transmitted through the respective cells C5 to C8 from the Z-axis direction.

Part of the P-polarized light component transmitted through the NPBS 423 and entering the NPBS 424 is transmitted through the NPBS 424, and the P-polarized light component reflected by the NPBS 424 is guided to the cells C9 to C12 arranged in the X-axis directions. The P-polarized light component that has been guided to the cells C9 to C12 enters and is transmitted through the respective cells C9 to C12 from the Z-axis direction.

The P-polarized light component transmitted through the NPBS 424 and entering the NPBS 425 is reflected by the NPBS 425 and guided to the cells C13 to C16 arranged in the X-axis directions. The P-polarized light component that has been guided to the cells C13 to C16 enters and is transmitted through the respective cells C13 to C16 from the Z-axis direction.

For example, relationships (R%:T%) between reflectance R and transmittance T of the P-polarized light component in the respective NPBS 422, 423, 424, 425 are as shown in the following table 1.

TABLE 1

| Non-polarizing beam splitter (NPBS) | 422 | 423 | 424 | 425 |
|---|---|---|---|---|
| Reflectance R:Transmittance T (P-polarized light component) | 25:75 | 33:67 | 50:50 | 100:0 |

In FIG. 9, the positions of the optical axes of the laser light L (P-polarized light component) entering and is transmitted through the cells C1 to C16 from the Z-axis direction are shown by "black points". Note that the direction in which the laser light L is guided to the plurality of cells arranged in the matrix form is not limited to the X-axis direction, but may be the Y-axis direction.

The first supporting part 408 has a portion overlapping with the first optical device 421 provided in correspondence with the cells C1 to C16 and a projection portion 408b projecting from the portion in the X-direction in the plan view along the Z-axis direction. In the embodiment, a surface of the projection portion 408b on the cell side is set as a first reference surface 408a.

Note that the form of the projection portion 408b is not limited to that, but may be provided as an extension of any four cells arranged in the X-axis direction of the cells C1 to C16, for example.

In FIG. 9, the cells C1 to C16 of the measurement magnetic sensor 411, the first optical device 421, and the first supporting part 408 are shown, and the magnetic field measuring apparatus 400 of the embodiment has a reference magnetic sensor corresponding to the measurement magnetic sensor 411, and the reference magnetic sensor has the same multichannel-type configuration as the measurement magnetic sensor 411. As below, the configuration of the magnetic field measuring apparatus 400 will be explained with reference to FIG. 10.

As shown in FIG. 10, the magnetic field measuring apparatus 400 has the measurement magnetic sensor 411 and the reference magnetic sensor 412 placed in the sensitive directions (Z-axis directions). The measurement magnetic sensor 411 has the cell array 402A including the cells C1 to C16, first polarization separating parts 1 03A provided for each cell, and light receiving elements 141, 142 (first light receiving part 104A). The reference magnetic sensor 412 has a cell array 402B including 16 cells C21 to C36, second polarization separating parts 103B provided for each cell, and light receiving elements 141, 142 (second light receiving part 104B).

Further, the magnetic field measuring apparatus 400 has the first supporting part 408 in which the measurement magnetic sensor 411 is incorporated, and a second supporting part 409 in which the reference magnetic sensor 412 is incorporated. The first optical device 421 that enters the laser light L into the respective cells of the cell array 402A from the Z-axis direction is provided between the bottom part of the first supporting part 408 as a structure and the cell array 402A.

The first optical device 421 has four non-polarizing beam splitters (NPBS) 426, 427, 428, 429 arranged side by side in the X-axis directions. Of the four NPBS 426, 427, 428, 429, the three NPBS 426, 427, 428 reflect and transmit the P-polarized light component of the laser light L and the NPBS 429 totally reflects the P-polarized light component of the laser light L.

Part of the P-polarized light component of the laser light L entering the NPBS 426 is transmitted, and the rest is reflected by the NPBS 426 in the Z-axis direction and enters the cell C1.

Part of the P-polarized light component of the laser light L transmitted through the NPBS 426 and entering the NPBS 427 is transmitted through the NPBS 427, and the rest is reflected by the NPBS 427 in the Z-axis direction and enters the cell C2.

Part of the P-polarized light component of the laser light L transmitted through the NPBS 427 and entering the NPBS 428 is transmitted through the NPBS 428, and the rest is reflected by the NPBS 428 in the Z-axis direction and enters the cell C3.

The P-polarized light component of the laser light L transmitted through the NPBS 428 and entering the NPBS 429 is reflected by the NPBS 429 in the Z-axis direction and enters the cell C4.

The first optical device 421 has four NPBS 426, 427, 428, 429 like those described above for the other cells C5 to C16.

Regarding the above described respective NPBS 426, 427, 428, 429 in the first optical device 421, relationships (R%:T%) between reflectance R and transmittance T in the P-polarized light component of the laser light L in the respective NPBS 426, 427, 428, 429 are set as shown in the following table 2, for example, so that the intensity of the laser light L transmitted through the cells C1 to C16 may be nearly equal with respect to each of the cells C1 to C16.

TABLE 2

| Non-polarizing beam splitter (NPBS) | 426 | 427 | 428 | 429 |
|---|---|---|---|---|
| Reflectance R:Transmittance T (P-polarized light component) | 25:75 | 33:67 | 50:50 | 100:0 |

A second optical device 431 that enters the laser light L into the respective cells of the cell array 402B from the Z-axis direction is provided between the bottom part of the second supporting part 409 as a structure and the cell array 402B. The configuration of the second optical device 431 is the same as the first optical device 421 and has a plurality of non-polarizing beam splitters (NPBS) that guide the laser light L to the respective cells. Specifically, the device has the non-polarizing beam splitters (NPBS) arranged side by side in the Y-axis directions and NPBS 436, 437, 438, 439 arranged side by side in the X-axis directions. The relationships between reflectance R and transmittance T of the P-polarized light component in the non-polarizing beam splitters (NPBS) arranged side by side in the Y-axis directions are the same as those of the NPBS 422, 423, 424, 425 of the first optical device 421 shown in the above described table 1.

Part of the P-polarized light component of the laser light L entering the NPBS 436 is transmitted, and the rest is reflected by the NPBS 436 in the Z-axis direction and enters the cell C21.

Part of the P-polarized light component of the laser light L transmitted through the NPBS 436 and entering the NPBS 437 is transmitted through the NPBS 437, and the rest is reflected by the NPBS 437 in the Z-axis direction and enters the cell C22.

Part of the P-polarized light component of the laser light L transmitted through the NPBS 437 and entering the NPBS 438 is transmitted through the NPBS 438, and the rest is reflected by the NPBS 438 in the Z-axis direction and enters the cell C23.

The P-polarized light component of the laser light L transmitted through the NPBS 438 and entering the NPBS 439 is reflected by the NPBS 439 in the Z-axis direction and enters the cell C24.

The second optical device 431 has four NPBS 436, 437, 438, 439 like those described above for the other cells C25 to C36.

Regarding the above described respective NPBS 436, 437, 438, 439 in the second optical device 431, relationships between reflectance R and transmittance T in the P-polarized light component of the laser light L in the respective NPBS are set so that the intensity of the laser light L transmitted through the cells C21 to C36 may be nearly equal with respect to each of the cells C21 to C36. Specifically, the relationships between reflectance R and transmittance T of the P-polarized light component in the NPBS 436, 437, 438, 439 are the same as those of the NPBS 426, 427, 428, 429 of the first optical device 421 shown in the above described table 2.

In the case where the measurement magnetic sensor 411 and the reference magnetic sensor 412 are of the multichannel-type, it is more preferable to provide a first light irradiation part 101A for the measurement magnetic sensor 411 and a second light irradiation part 101B for the reference magnetic sensor 412 than to guide the laser light L from a single light irradiation part 110 to the two sets of cell arrays 402A, 402B. Compared to the case using the single light irradiation part 110, the intensity of the laser light L output from the light source 111 may be suppressed and the intensity of the laser light L transmitted through the respective cells may be made to be nearly equal.

In the magnetic field measuring apparatus 400 of the embodiment, for example, suppose that the cell C1 is a first cell in the invention, the cell C2 corresponds to a third cell in the invention. Similarly, suppose that the cell C21 is a second cell in the invention, the cell C22 corresponds to a fourth cell in the invention.

The second supporting part 409 in which the reference magnetic sensor 412 and the second optical device 431 are incorporated is superimposed on the first supporting part 408 in which the measurement magnetic sensor 411 and the first optical device 421 are incorporated in the sensitive directions (Z-axis directions).

In the plan view along the Z-axis direction, the second supporting part 409 has a projection portion 409b in a position overlapping with the projection portion 408b in the first supporting part 408. A surface of the projection portion 408b on the cell array 402A side is set as a first reference surface 408a and a surface of the projection portion 409b on the cell array 402B side is set as a second reference surface 409a.

Note that a heating part (not shown in FIG. 10) for adjusting the temperatures of the respective cells of the cell array 402A to temperatures suitable for magnetic field measurement is provided between the first optical device 421 and the cell array 402A on the first reference surface 408a. The heating part is e.g. a plate-like ceramic heater and placed not to hinder the incidence of the laser light L to the respective cells of the cell array 402A. Similarly, a heating part is provided between the second optical device 431 and the cell array 402B on the second reference surface 409a.

In the sensitive directions (Z-axis directions), a laser autocollimator 170 is provided to be able to irradiate the respective first reference surface 408a and second reference surface 409a with beam lights. The beam light is radiated from the laser autocollimator 170 to the first reference surface 408a, and the laser autocollimator 170 detects the orientation of an optical axis of a beam light B1 as a first reflected light reflected by the first reference surface 408a. Similarly, the laser autocollimator 170 is relatively moved in the X-axis direction, the beam light is radiated from the laser autocollimator 170 to the second reference surface 409a, and the laser autocollimator 170 detects the orientation of an optical axis of a beam light B2 as a second reflected light reflected by the second reference surface 409a.

The magnetic field measuring apparatus 400 has a position adjustment mechanism that can adjust the relative position of the second supporting part 409 to the first supporting part 408. In the magnetic field measuring apparatus 400, the position of the second supporting part 409 with respect to the first supporting part 408 is adjusted by the position adjustment mechanism so that the orientation of the optical axis of the beam light B1 and the orientation of the optical axis of the beam light B2 detected by the laser autocollimator 170 may be the same direction.

A manufacturing method of the magnetic field measuring apparatus 400 is basically the same as the manufacturing method of the magnetic field measuring apparatus 100 of the above described first embodiment, and includes a placement step of sequentially placing the cell array 402A and the cell array 402B in the sensitive directions of the magnetic field, an optical axis detection step of detecting the orientation of the optical axis of the beam light B1 as the first reflected light of the beam light relating to the first reference surface 408a and the orientation of the optical axis of the beam light B2 as the second reflected light of the beam light relating to the second reference surface 409a, and a position adjustment step of adjusting the position of the second reference surface 409a with respect to the first reference surface 408a, in other words, adjusting the position of the second supporting unit 409 with respect to the first supporting unit 408 so that the orientation of the optical axis of the beam light B1 and the orientation of the optical axis of the beam light B2 may be the same direction based on a result of the optical axis detection step.

The above described optical axis detection step has a first step of detecting the orientation of the optical axis of the beam light B1 relating to the first reference surface 408a and a second step of detecting the orientation of the optical axis of the beam light B2 relating to the second reference surface 409a. The second step is performed after the above described placement step, and detects the orientation of the optical axis of the beam light B2 with reference to the orientation of the optical axis of the beam light B1 detected at the first step.

According to the magnetic field measuring apparatus 400 of the fourth embodiment and the manufacturing method thereof, the laser light as linearly-polarized light enters the respective cells placed in the gradio-type and multichannel-type from the same direction. In other words, the gradio-type and multichannel-type magnetic field measuring apparatus 400, in which the orientations of the laser optical axes $L_O$ in the respective cells are the same direction, that can properly eliminate the influence (noise) of the external magnetic fields EM and accurately measure the magnetic field of the magnetic field source M1 by the measurement magnetic sensor 411 and the manufacturing method thereof may be provided. The magnetic field measuring apparatus 400 is of the multichannel-type, and thereby, the magnetic field of the magnetic field source M1 may be measured over the wider range compared to those in the respective magnetic field measuring apparatuses of the above described first to third embodiments.

At the above described position adjustment step, the position of the second reference surface 409a with respect to the first reference surface 408a may be easily adjusted using the detection result of the second step. That is, in the respective two magnetic sensors 411, 412, the orientations of the laser optical axes $L_O$ in the cell array 402A and the cell array 402B may be adjusted more easily than in the case where the orientations of the laser optical axes $L_O$ are individually adjusted and the placement step is performed. In other words, even the multichannel-type may easily adjust the orientations of the laser optical axes $L_O$ of the laser light L that functions as probe light.

The invention is not limited to the above described embodiments, but changes may be appropriately made in a range not contrary to the gist or ideas of the invention read from the appended claims and the entire specification. The magnetic field measuring apparatuses and the manufacturing methods of the magnetic field measuring apparatuses with the changes fall within the technical scope of the invention. Various other modified examples than the above described embodiments are conceivable. As below, the explanation will be made by taking modified examples.

Modified Example 1

Figure 11:
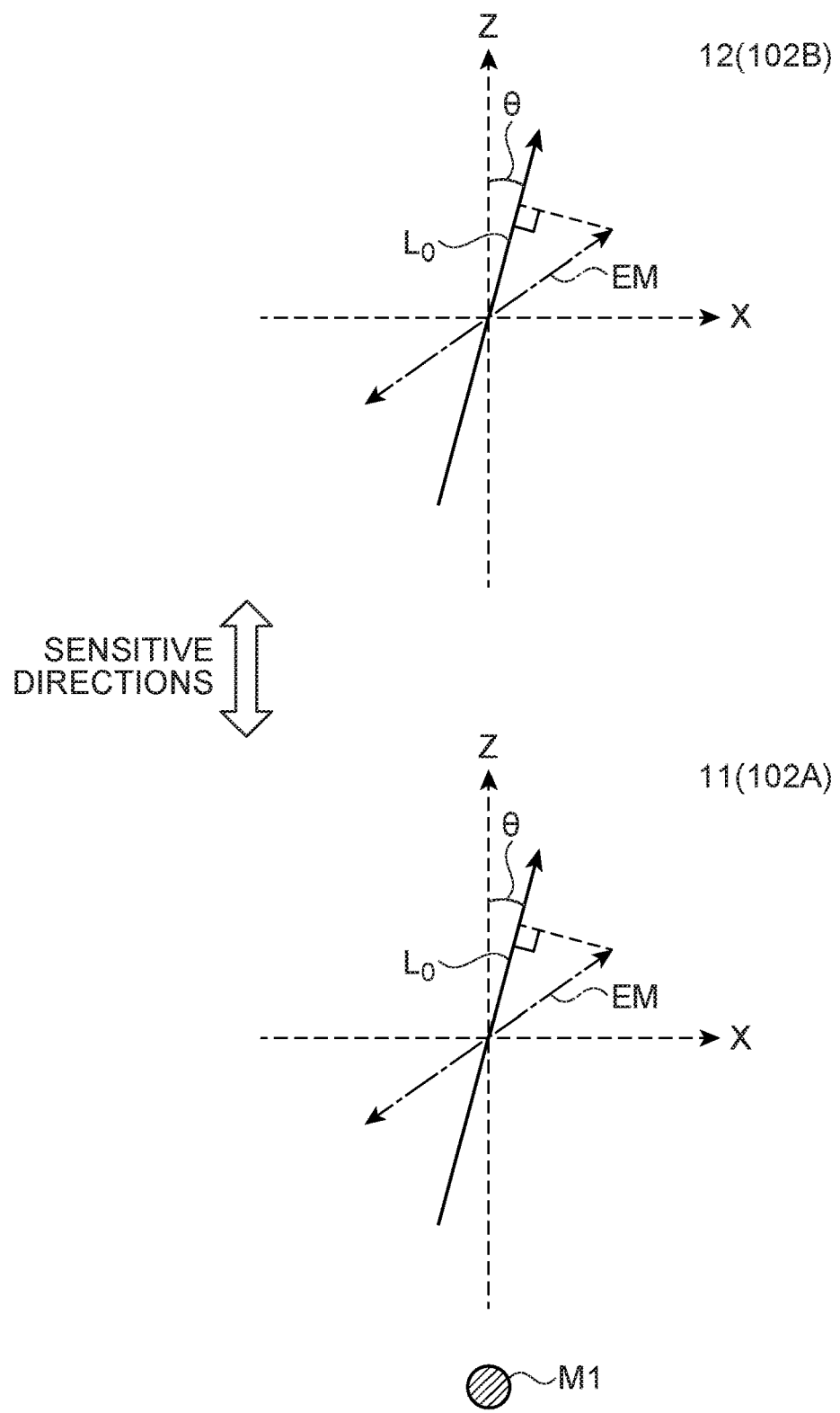
FIG. 11 is a schematic view showing relationships between orientations of laser optical axes and external magnetic fields in a modified example.
Figure 12:
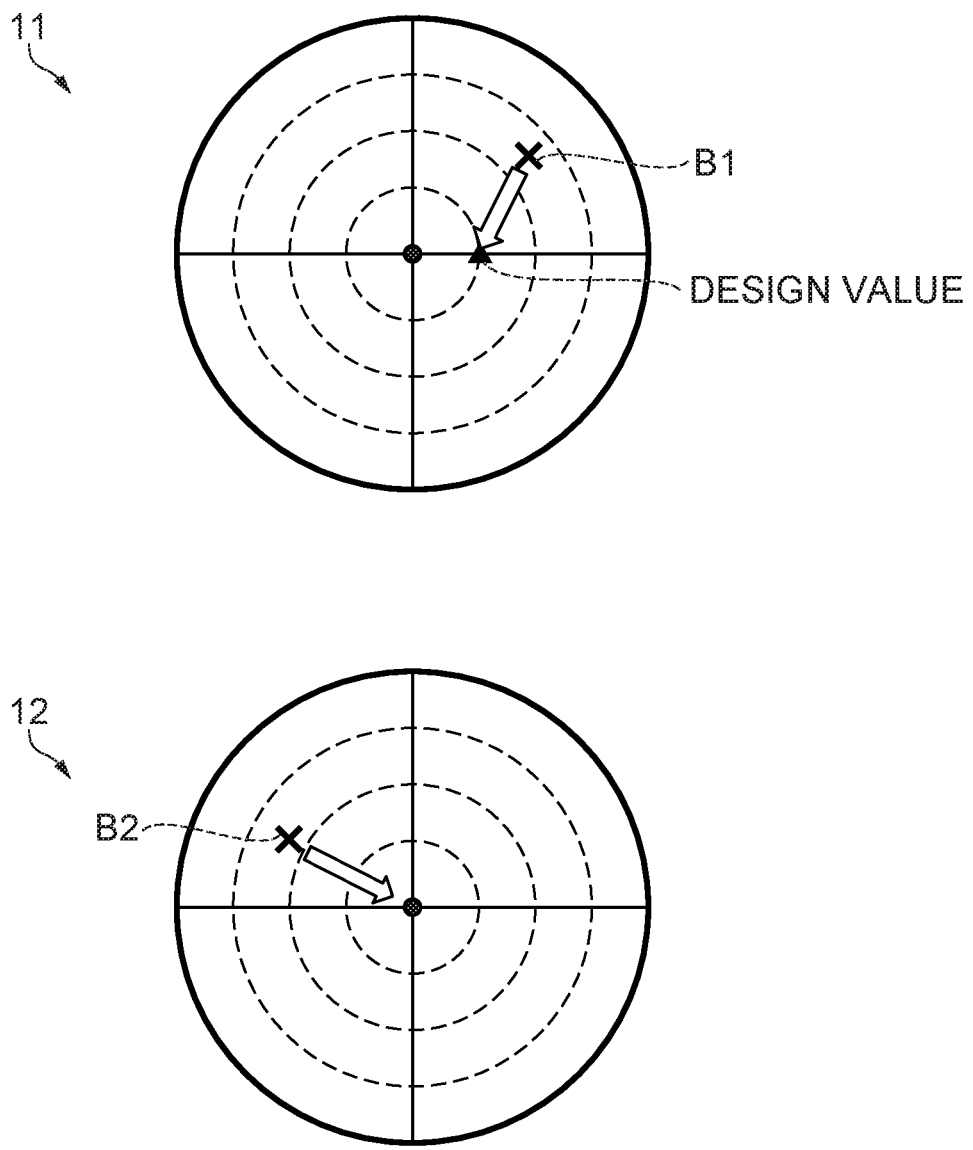
FIG. 12 is a schematic view showing an adjustment method of the orientations of the laser optical axes in the modified example.

The orientation of the laser optical axis $L_O$ of the laser light L that functions as probe light and the sensitive direction do not necessarily coincide. FIG. 11 is a schematic view showing relationships between orientations of laser optical axes and external magnetic fields in the modified example. FIG. 12 is a schematic view showing an adjustment method of the orientations of the laser optical axes in the modified example. Specifically, FIGS. 11 and 12 are based on the magnetic field measuring apparatus 100 of the first embodiment and the manufacturing method thereof.

As shown in FIG. 11, the laser optical axes $L_O$ of the cells 102A, 102B of the two magnetic sensors 11, 12 in the modified example cross at an angle θ with respect to the sensitive directions (Z-axis directions). Even when the sensitive directions (Z-axis directions) and the orientations of the laser optical axes $L_O$ do not coincide, it is only necessary that the orientations of the laser optical axes $L_O$ are the same in the cells 102A, 102B of the two magnetic sensors 11, 12. According to the configuration, the levels of the noise of the external magnetic fields EM sensed by the two magnetic sensors 11, 12 are the same, and the magnitude of the magnetic field of the magnetic field source M1 maybe accurately measured by the measurement magnetic sensor 11 by the calculation of the difference in output between the two magnetic sensors 11, 12 by the signal processing unit 105.

It is not necessary that the sensitive directions (Z-axis directions) and the orientations of the laser optical axes $L_O$ coincide, and thereby, the degree of freedom of the position of the magnetic field source M1 placed with respect to the cells and the degree of freedom of the position of the light irradiation part that radiates the laser light L are improved and a more compact and highly sensitive magnetic field measuring apparatus may be provided.

In the manufacturing method of the magnetic field measuring apparatus of the modified example, for example, as shown in FIG. 12, the orientation (coordinates) of the optical axis of the beam light B1 relating to the first reference surface 108a is detected at the first step of the optical axis detection step. Then, the position of the measurement magnetic sensor 11 with respect to the first reference surface 108a is adjusted so that a design value corresponding to the above described angle θ apart from the reference point (e.g. the coordinates shown by "triangle" in FIG. 12) and the orientation (coordinates) of the optical axis of the beam light B1 shown by "x" may coincide. Subsequently, the second step is performed after the placement step, and the orientation of the optical axis of the beam light B2 reflected relating to the second reference surface 109a in the reference magnetic sensor 12 is detected with the orientation of the optical axis of the beam light B1 set to the above described design value as reference (reference point). Then, the position adjustment step of adjusting the position of the second reference surface 109a with respect to the first reference surface 108a is performed based on the detection result of the second step. According to the method, in the in the first cell 102A and the second cell 102B, the orientations of the laser optical axes Lo may be set in directions crossing the sensitive directions (Z-axis directions) at the angle θ.

Modified Example 2

At the optical axis detection step in the manufacturing methods of the magnetic field measuring apparatuses of the above described embodiments, the first step of detecting the orientation of the optical axis of the beam light B1 as the first reflected light of the beam light relating to the first reference surface is not limited to be performed after the placement step of sequentially placing the first cell and the second cell in the sensitive directions of the magnetic field. The first step may be performed before the placement step, and the second step of detecting the orientation of the optical axis of the beam light B2 as the second reflected light of the beam light relating to the second reference surface with reference to the detected orientation of the optical axis of the beam light B1 relating to the first reference surface may be performed after the placement step. In this manner, it is not necessary to make the size of the first reference surface larger than the size of the second reference surface and the apparatus may be downsized.

Modified Example 3

In the magnetic field measuring apparatuses of the above described respective embodiments, the laser autocollimator 170 is not the essential configuration. That is, at the optical axis detection step of the manufacturing method of the magnetic field measuring apparatus, the orientation of the optical axis of the beam light B1 relating to the first reference surface and the orientation of the optical axis of the beam light B2 relating to the second reference surface may be detected using the laser autocollimator 170. After the position adjustment step ends, the laser autocollimator 170 maybe detached from the magnetic field measuring apparatus. Note that, if a configuration with the laser autocollimator 170 constantly provided therein is employed, whether or not the orientations of the laser optical axes $L_O$ are the same direction in the first cell and the second cell can be appropriately monitored.

Modified Example 4

In the magnetic field measuring apparatus 400 of the above described fourth embodiment, the optical flats 220 as reflection members shown in the above described second embodiment may be placed on the first reference surface 408a and the second reference surface 409a.

Modified Example 5

In the magnetic field measuring apparatus 400 of the above described fourth embodiment, the laser light L entering the first optical device 421 may contain a P-polarized light component and an S-polarized light component. In this case, the first optical device 421 may be a polarizing beam splitter (PBS), the laser light L may be entered therein and separated into the P-polarized light component and the S-polarized light component, and one of the components may be guided to the respective cells C1 to C16. The same applies to the second optical device 431.

The entire disclosure of Japanese Patent Application No. 2016-117701 filed Jun. 14, 2016 is expressly incorporated by reference herein.

What is claimed is:

1. A magnetic field measuring apparatus comprising:
   a light irradiation part that radiates linearly-polarized light;
   a first cell and a second cell with alkali metal atoms enclosed therein sequentially placed in a sensitive direction of a magnetic field;
   a first optical device placed on a first reference surface and entering the linearly-polarized light into the first cell; and
   a second optical device placed on a second reference surface and entering the linearly-polarized light into the second cell,
   wherein a position of the second reference surface with respect to the first reference surface is adjusted so that an orientation of an optical axis of a first reflected light of light relating to the first reference surface and an orientation of an optical axis of a second reflected light of light relating to the second reference surface in parallel to that light may be the same direction.

2. The magnetic field measuring apparatus according to claim. 1, further comprising an optical axis detection part that can radiate beam light as the light and detect an orientation of an optical axis of the first reflected light of the beam light relating to the first reference surface and an orientation of an optical axis of the second reflected light of the beam light relating to the second reference surface.

3. The magnetic field measuring apparatus according to claim 1, reflection members are provided on the first reference surface and the second reference surface.

4. The magnetic field measuring apparatus according to claim 1, further comprising:
   a third cell placed in a direction orthogonal to the sensitive direction with respect to the first cell; and
   a fourth cell placed in a direction orthogonal to the sensitive direction with respect to the second cell.

5. The magnetic field measuring apparatus according to claim 4, wherein the light irradiation part includes a first light irradiation part that irradiates the first cell and the third cell with the linearly-polarized light and a second light irradiation part that irradiates the second cell and the fourth cell with the linearly-polarized light.

6. The magnetic field measuring apparatus according to claim 1, wherein the sensitive direction of the magnetic field and incident directions of the linearly-polarized light in the first cell and the second cell cross.

7. A manufacturing method of a magnetic field measuring apparatus including
   a light irradiation part that radiates linearly-polarized light,
   a first cell and a second cell with alkali metal atoms enclosed therein,
   a first optical device placed on a first reference surface and entering the linearly-polarized light into the first cell, and
   a second optical device placed on a second reference surface and entering the linearly-polarized light into the second cell,
   the method comprising:
   a placement step of sequentially placing the first cell and the second cell in a sensitive direction of a magnetic field;
   an optical axis detection step of detecting an orientation of an optical axis of a first reflected light of light relating to the first reference surface and an orientation of an optical axis of a second reflected light of light relating to the second reference surface in parallel to that light; and
   a position adjustment step of adjusting a position of the second reference surface with respect to the first reference surface so that the orientation of the optical axis of the first reflected light and the orientation of the optical axis of the second reflected light may be the same direction based on a result of the optical axis detection step.

8. The manufacturing method according to claim 7, wherein the optical axis detection step includes:
   a first step of detecting the orientation of the optical axis of the first reflected light; and
   a second step of detecting the orientation of the optical axis of the second reflected light, and
   the second step is performed after the placement step and detects the orientation of the optical axis of the second reflected light with reference to the orientation of the optical axis of the first reflected light detected at the first step.

* * * * *